United States Patent
Moon et al.

(10) Patent No.: US 9,760,209 B2
(45) Date of Patent: *Sep. 12, 2017

(54) ELECTRODE SHEET AND TOUCH INPUT DEVICE

(71) Applicant: HiDeep Inc., Gyeonggi-do (KR)

(72) Inventors: Hojun Moon, Gyeonggi-do (KR);
Bonkee Kim, Gyeonggi-do (KR);
Seyeob Kim, Gyeonggi-do (KR);
Sangsic Yoon, Gyeonggi-do (KR);
Sunyoung Kwon, Gyeonggi-do (KR);
Taehoon Kim, Gyeonggi-do (KR)

(73) Assignee: HiDeep Inc. (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/388,016

(22) Filed: Dec. 22, 2016

(65) Prior Publication Data

US 2017/0102823 A1    Apr. 13, 2017

Related U.S. Application Data

(63) Continuation of application No. 14/992,403, filed on Jan. 11, 2016, now Pat. No. 9,563,309, which is a
(Continued)

(30) Foreign Application Priority Data

Feb. 11, 2015    (KR) .................. 10 2015 0020714

(51) Int. Cl.
*G06F 3/041* (2006.01)
*G06F 3/044* (2006.01)

(52) U.S. Cl.
CPC ............ *G06F 3/0416* (2013.01); *G06F 3/044* (2013.01); *G06F 3/0414* (2013.01); *G06F 2203/04105* (2013.01)

(58) Field of Classification Search
CPC ...... G06F 3/044; G06F 3/0412; G06F 3/0414; G06F 3/0416; G06F 3/0418;
(Continued)

(56) References Cited

U.S. PATENT DOCUMENTS 9,262,031 B1    2/2016  Moon et al.
2010/0024573 A1    2/2010  Daverman et al.
(Continued)

FOREIGN PATENT DOCUMENTS

JP    2012064108    3/2012
JP    2012073783    4/2012
(Continued)

*Primary Examiner* — Dmitriy Bolotin
(74) *Attorney, Agent, or Firm* — The Belles Group, P.C.

(57) ABSTRACT

In one embodiment, a touch input device capable of detecting a pressure of a touch on a touch surface includes a display panel and an electrode disposed under the display panel. An electrical characteristic detected at the electrode is changed by the bending of the display panel. A magnitude of the pressure applied to the touch surface is detected according to the change amount of the electrical characteristic. The display panel includes a first area and a second area. A pressure detection sensitivity of the first area is higher than a pressure detection sensitivity of the second area. When the first area and the second are bent to the same degree, a change amount of the electrical characteristic detected when a pressure is applied to the second area is greater than a change amount of the electrical characteristic detected when a pressure is applied to the first area.

17 Claims, 20 Drawing Sheets

Related U.S. Application Data continuation of application No. 14/817,472, filed on Aug. 4, 2015, now Pat. No. 9,262,031.

(58) Field of Classification Search
CPC .. G06F 2203/04111; G06F 2203/04112; G06F 2203/04105; H03K 17/9622; H03K 2017/9602; H03K 2017/960705
See application file for complete search history.

(56) References Cited

U.S. PATENT DOCUMENTS

| | | |
|---|---|---|
| 2012/0068965 A1 | 3/2012 | Wada et al. |
| 2012/0075238 A1 | 3/2012 | Minami et al. |
| 2015/0035761 A1 | 2/2015 | Seo et al. |
| 2015/0160778 A1 | 6/2015 | Kim et al. |
| 2015/0234498 A1 | 8/2015 | Cho et al. |
| 2015/0268766 A1 | 9/2015 | Kim et al. |
| 2015/0292970 A1 | 10/2015 | Gando et al. |

FOREIGN PATENT DOCUMENTS

| | | |
|---|---|---|
| KR | 1100853 | 8/2011 |
| KR | 20150015212 | 2/2015 |
| WO | 2011142333 | 11/2011 |

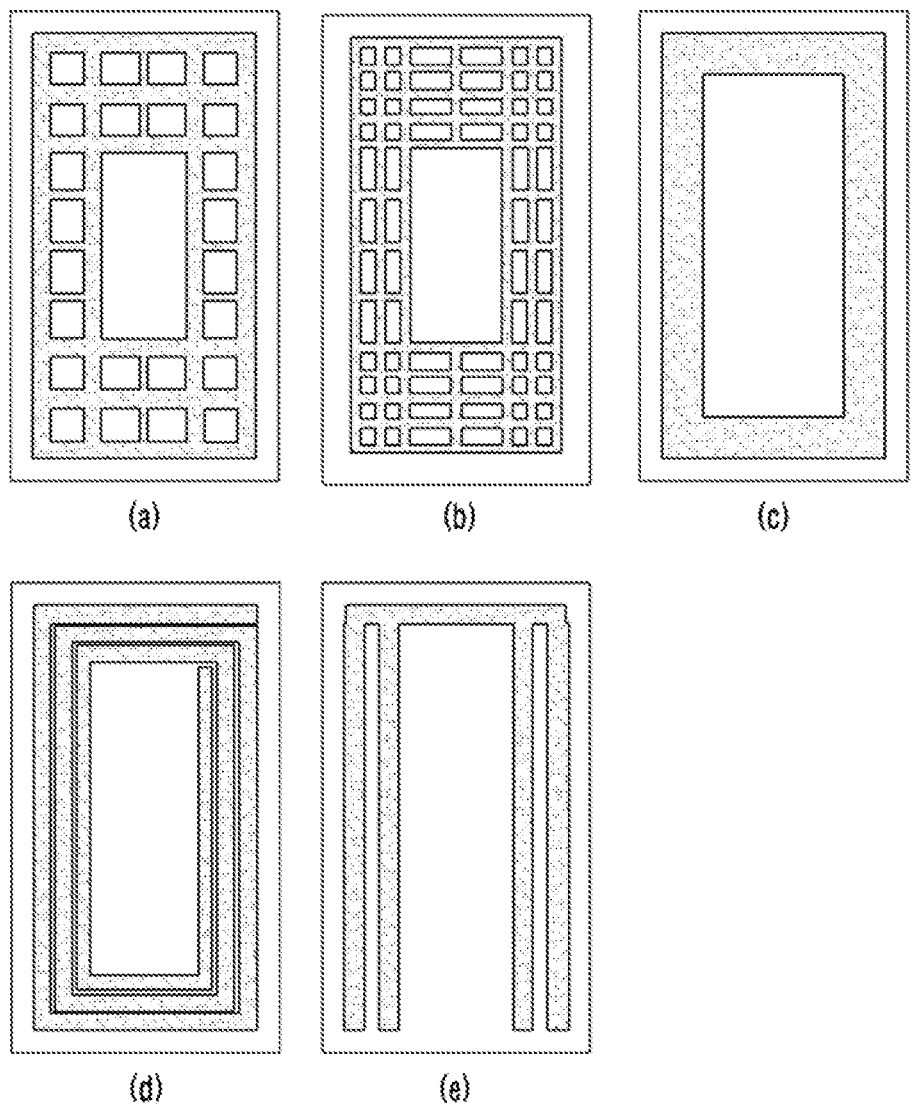

CAPACITANCE CHANGE AMOUNT ACCORDING TO POSITION ON TOUCH SCREEN

ELECTRODE SHEET AND TOUCH INPUT DEVICE

CROSS REFERENCE TO RELATED APPLICATIONS

The present application is a continuation of U.S. patent application Ser. No. 14/992,403, filed Jan. 11, 2016, which a continuation application of U.S. patent application Ser. No. 14/817,472 (now U.S. Pat. No. 9,262,031), filed Aug. 4, 2015, which claims priority under 35 U.S.C. §119 to Korean Patent Application No. 10-2015-0020714, filed Feb. 1, 2015, the disclosures of which are incorporated herein by reference in their entireties.

FIELD OF THE INVENTION

The present invention relates to an electrode sheet and a touch input device, and more particularly to a touch input device which includes a display panel and is configured to detect a touch pressure with a certain magnitude according to a touch position, and an electrode sheet.

BACKGROUND OF THE INVENTION

Various kinds of input devices are being used to operate a computing system. For example, the input device includes a button, key, joystick and touch screen. Since the touch screen is easy and simple to operate, the touch screen is increasingly being used in operation of the computing system.

The touch screen may constitute a touch surface of a touch input device including a touch sensor panel which may be a transparent panel including a touch-sensitive surface. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and the touch position on the touch screen and analyzes the touch, and thus, performs the operations in accordance with the analysis.

Here, there is a demand for a touch input device capable of detecting a touch pressure with a certain magnitude in accordance with a touch position on the touch screen without degrading the performance of the display panel.

SUMMARY OF THE INVENTION

In one embodiment, a touch input device capable of detecting a pressure of a touch on a touch surface includes a display panel; and an electrode disposed under the display panel; wherein, when a pressure is applied to the touch surface, the display panel is bent; wherein an electrical characteristic which is detected at the electrode is changed by the bending of the display panel; wherein a magnitude of the pressure applied to the touch surface is detected according to the change amount of the electrical characteristic: wherein the display panel comprises a first area and a second area; wherein a pressure detection sensitivity of the first area is higher than a pressure detection sensitivity of the second area; and wherein, tinder a condition that the first area and the second area of the display panel are bent to the same degree, a change amount of the electrical characteristic detected when a pressure is applied to the second area is greater than a change amount of the electrical characteristic detected when a pressure is applied to the first area.

In another embodiment, an electrode sheet is disposed on a touch input device comprising a display panel and is used to detect a magnitude of a pressure applied to a touch surface of the touch input device. The electrode sheet includes a first insulation layer and a second insulation layer; and an electrode located between the first insulation layer and the second insulation layer; wherein, when a pressure is applied to the touch surface, the display panel is bent; wherein an electrical characteristic which is detected at the electrode is changed by the bending of the display panel; wherein a magnitude of the pressure applied to the touch surface is detected according to the change amount of the electrical characteristic; wherein the display panel comprises a first area and a second area: wherein a pressure detection sensitivity of the first area is higher than a pressure detection sensitivity of the second area; and wherein, under a condition that the first area and the second area of the display panel are bent to the same degree—a change amount of the electrical characteristic detected when a pressure is applied to the second area is greater than a change amount of the electrical characteristic detected when a pressure is applied to the first area.

One embodiment is a touch input device capable of detecting a pressure of a touch on a touch surface. The touch input device includes: a display panel, and an electrode disposed under the display panel. When a pressure is applied to the touch surface, a distance between the electrode and a reference potential layer may be changed. A capacitance which is detected at the electrode is changed according to the distance change. The display panel includes a first area and a second area. Under the same distance change condition, a capacitance change amount detected at the electrode disposed under the second area may be greater than a capacitance change amount detected at the electrode disposed under the first area.

Another embodiment is an electrode sheet including a first insulation layer and a second insulation layer, and an electrode located between the first insulation layer and the second insulation layer. A capacitance which is detected at the electrode may be charmed according to a relative distance change between the electrode sheet and a reference potential layer which is disposed apart from the electrode sheet. The electrode sheet includes a first area and a second area. Under the same distance change condition, a capacitance change amount detected at the electrode disposed in the second area may be greater than a capacitance change amount detected at the electrode disposed in the first area.

BRIEF DESCRIPTION OF THE DRAWINGS

FIGS. 8g and 8h are cross sectional views when a pressure is applied to the touch input device shown in FIG. 7d in accordance with a fourth method in the embodiment of the present invention;

FIGS. 9 to 14 show the pressure electrodes which can be applied to the first and second embodiments of the present invention respectively.

DETAILED DESCRIPTION OF THE INVENTION

Figure 1:
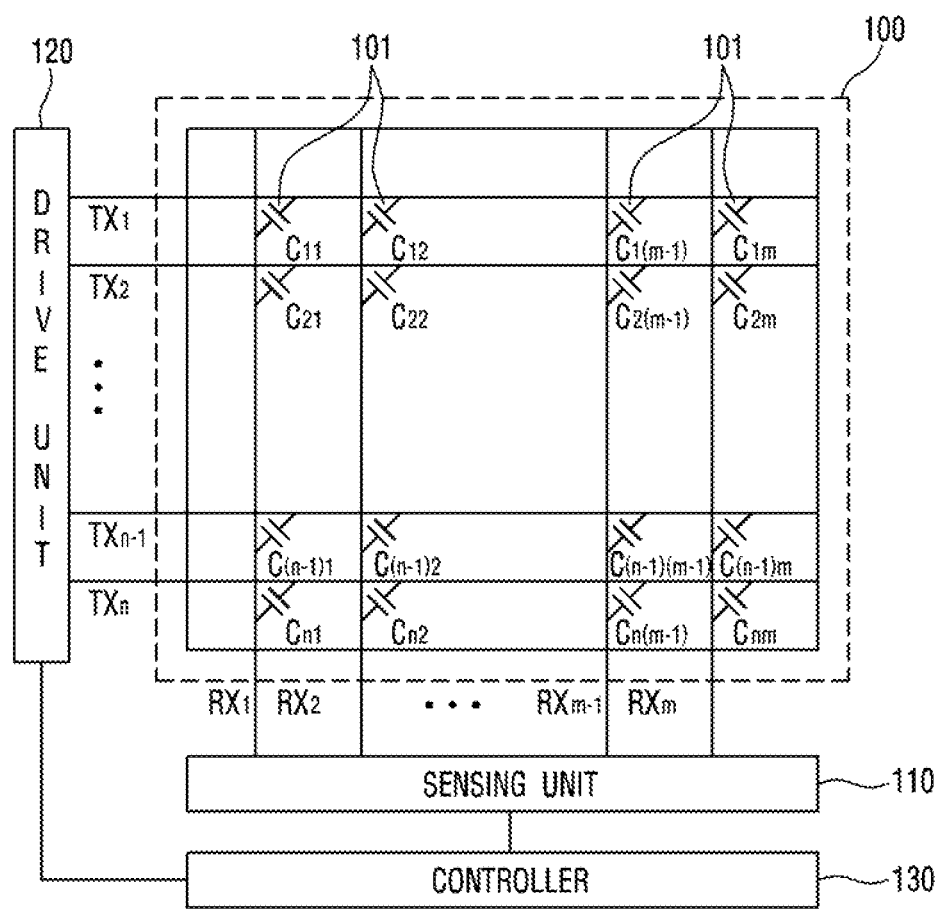
FIG. 1 is a schematic view of a configuration of a capacitance type touch sensor panel and the operation thereof in accordance with an embodiment of the present invention.

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions or placements of individual components within each disclosed embodiment may be changed without departing from the spirit and scope of the present invention. Therefore, the following detailed description is not intended to be limited. If adequately described, the scope of the present invention is limited only by the appended claims of the present invention as well as all equivalents thereto. Similar reference numerals in the drawings designate the same or similar functions in many aspects.

A touch input device according to an embodiment of the present invention will be described with reference to the accompanying drawings. While a capacitance type touch sensor panel 100 and a pressure detection module 400 are described below, the touch sensor panel 100 and the pressure detection module 400 may be adopted, which are capable of detecting a touch position and/or touch pressure by any method.

FIG. 1 is a schematic view of a configuration of the capacitance touch sensor panel 100 and the operation thereof in accordance with the embodiment of the present invention. Referring to FIG. 1, the touch sensor panel 100 according to the embodiment of the present invention may include a plurality of drive electrodes TX1 to TXn and a plurality of receiving electrodes RX1 to RXm, and may include a drive unit 120 which applies a driving signal to the plurality of drive electrodes TX1 to TXn for the purpose of the operation of the touch sensor panel 100, and a sensing unit 110 which detects the touch and the touch position by receiving a sensing signal including information on the capacitance change amount changing according to the touch on the touch surface of the touch sensor panel 100.

As shown in FIG. 1, the touch sensor panel 100 may include the plurality of drive electrodes TX1 to TXn and the plurality of receiving electrodes RX1 to RXm. While FIG. 1 shows that the plurality of drive electrodes TX1 to TXn and the plurality of receiving electrodes RX1 to RXm of the touch sensor panel 100 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

As shown in FIG. 1, the plurality of drive electrodes TX1 to TXn and the plurality of receiving electrodes RX1 to RXm may be arranged to cross each other. The drive electrode TX may include the plurality of drive electrodes RX1 to TXn extending in a first axial direction. The receiving electrode RX may include the plurality of receiving electrodes RX1 to RXm extending in a second axial direction crossing the first axial direction.

In the touch sensor panel 100 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on the same side of an insulation layer (not shown). Also, the plurality of drive electrodes TX1 to TXn and the plurality of receiving electrodes RX1 to RXm may be formed in the different layers. For example, the plurality of drive electrodes TX1 to TXn and the plurality of receiving electrodes RX1 to RXm may be formed on both sides of one insulation layer (not shown) respectively, or the plurality of drive electrodes TX1 to TXn may be formed on a side of a first insulation layer (not shown) and the plurality of receiving electrodes RX1 to RXm may be formed on a side of a second insulation layer (not shown) different from the first insulation layer.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may be formed to include at least any one of silver ink, copper or carbon nanotube (CNT). Also, the drive electrode TX and the receiving electrode RX may be made of metal mesh or nano silver.

The drive unit 120 according to the embodiment of the present invention may apply a driving signal to the drive electrodes TX1 to TXn. In the embodiment of the present invention, one driving signal may be sequentially applied at a time to the first drive electrode TX1 to the n-th drive electrode TXn. The driving signal may be applied again repeatedly. This is only an example. The driving signal may be applied to the plurality of drive electrodes at the same time in accordance with the embodiment.

Through the receiving electrodes RX1 to RXm, the sensing unit 110 receives the sensing signal including information on a capacitance (Cm) 101 generated between the receiving electrodes RX1 to RXm and the drive electrodes TX1 to TXn to which the driving signal has been applied, thereby detecting whether or not the touch has occurred and where the touch, has occurred. For example, the sensing signal may be a signal coupled by the capacitance (CM) 101 generated between the receiving electrode RX and the drive electrode TX to which the driving signal has been applied. As such, the process of sensing the driving signal applied from the first drive electrode TX1 to the n-th drive electrode TXn through the receiving electrodes RX1 to RXm can be referred to as a process of scanning the touch sensor panel 100.

For example, the sensing unit 110 may include a receiver (not shown) which is connected to each, of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here the positive (+) input terminal of the amplifier may be connected to the ground. Also, the receiver may further include a reset switch which is connected in parallel with the feedback capacitor. The reset switch may reset the conversion from current to voltage that is performed. In the receiver the negative input terminal of the amplifier is connected to the corresponding receiving electrode RX and receives and integrates a current signal including information on the capacitance (CM) 101, and then converts the integrated current signal into voltage. The sensing unit 110 may further include an analog to digital converter (ADC) (not shown) which converts the integrated data by the receiver into digital data. Later, the digital data may be input to a processor (not shown) and processed to obtain information on the touch on the touch sensor panel 100. The sensing unit 110 may include the ADC and processor as well as the receiver.

A controller 130 may perform a function of controlling the operations of the drive unit 120 and the sensing unit 110. For example, the controller 130 generates and transmits a drive control signal to the drive unit 120, so that the driving signal can be applied to a predetermined drive electrode TX1 at a predetermined time. Also, the controller 130 generates and transmits the drive control signal to the sensing unit 110, so that the sending unit 110 may receive the sending signal from the predetermined receiving electrode RX at a predetermined time and perform a predetermined function.

In FIG. 1, the drive unit 120 and the sensing unit 110 may constitute a touch detection device (not shown) capable of detecting whether the touch has occurred on the touch sensor panel 100 according to the embodiment of the present invention or not and where the touch has occurred. The touch detection device according to the embodiment of the present invention may further include the controller 130. The touch detection device according to the embodiment of the present invention may be integrated and implemented on a touch sensing integrated circuit (IC) (not shown) in a touch input device 1000 including the touch sensor panel 100. The drive electrode IX and the receiving electrode RX included in the touch sensor panel 100 may be connected to the drive unit 120 and the sensing unit 110 included in the touch sensing IC through, for example, a conductive trace and/or a conductive pattern printed on a circuit board, or the like. The touch sensing IC may be located on a circuit board on which the conductive pattern has been printed. According to the embodiment, the touch sensing IC may be mounted on a main board for operation of the touch input device 1000.

As described above, a capacitance (C) with a predetermined value is generated at each crossing of the drive electrode TX and the receiving electrode RX. When an object like a finger approaches close to the touch sensor panel 100, the value of the capacitance may be changed. In FIG. 1 the capacitance may represent a mutual capacitance (Cm). The sensing unit 110 senses such electrical characteristics, thereby being able to sense whether the touch has occurred on the touch sensor panel 100 or not and where the touch has occurred. For example, the sensing unit 110 is able to sense whether the touch has occurred on the surface of the touch sensor panel 100 comprised of a two-dimensional plane consisting of a first axis and a second axis.

More specifically, when the touch occurs on the touch sensor panel 100, the drive electrode TX to which the driving signal has been applied is detected, so that the position of the second axial direction of the touch can be detected. Likewise, when the touch occurs on the touch sensor panel 100, the capacitance change is detected from the reception signal received through the receiving electrode RX, so that the position of the first axial direction of the touch can be detected.

The mutual capacitance type touch sensor panel as the touch sensor panel 100 has been described in detail in the foregoing. However, in the touch input device 1000 according to the embodiment of the present invention the touch sensor panel 100 for detecting whether or not the touch has occurred and where the touch has occurred may be implemented by using not only the above-described method but also any touch sensing method like a self-capacitance type method, a surface capacitance type method, a projected capacitance type method, a resistance film method, a surface acoustic wave (SAW) method, an infrared method, an optical imaging method, a dispersive signal technology, and an acoustic pulse recognition method, etc.

The touch sensor panel 100 for detecting where the touch has occurred in the touch input device 1000 according to the embodiment of the present invention may be positioned outside or inside a display panel 200.

The display panel 200 of the touch input device 1000 according to the embodiment of the present invention may be a display panel included in a liquid crystal display (LCD), a plasma display panel (PDP), an organic light emitting diode (OLED), etc. Accordingly, a user may perform the input operation by touching the touch surface while visually identifying an image displayed on the display panel. Here, the display panel 200 may include a control circuit which receives an input from an application processor (AP) or a central processing unit (CPU) on a main board for the operation of the touch input device 1000 and displays the contents that the user wants on the display panel. Here, the control circuit for the operation of the display panel 200 may include a display panel control IC, a graphic controller IC, and a circuit required to operate other display panels 200.

Figure 2A:
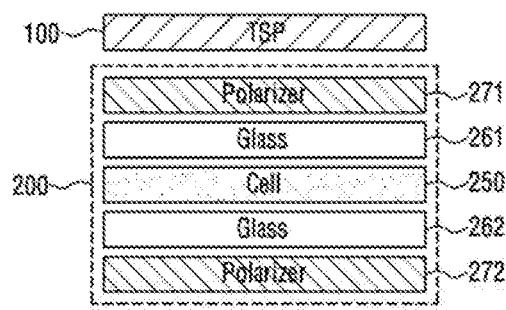
FIGS. 2a, 2b and 2c are conceptual views showing a relative position of the touch sensor panel with respect to a display panel in a touch input device according to the embodiment of the present invention.
Figure 2B:
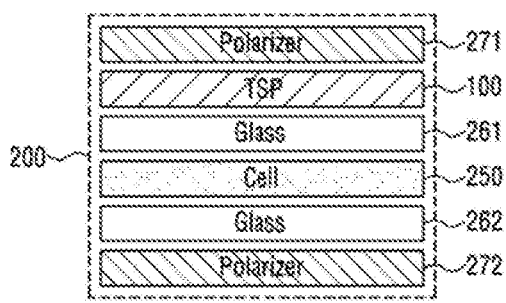
Figure 2C:
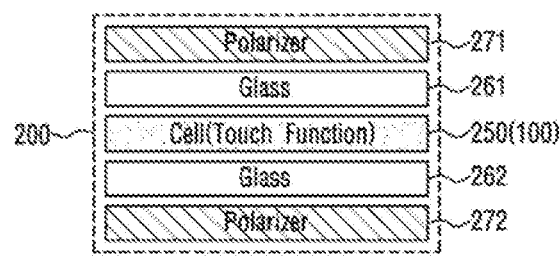

FIGS. 2a, 2b and 2c are conceptual views showing a relative position of the touch sensor panel with respect to the display panel in the touch input device according to the embodiment of the present invention. While FIGS. 2a to 2c show an LCD panel as a display panel, this is just an example. Any display panel may be applied to the touch input device 1000 according to the embodiment of the present invention.

In this specification, the reference numeral 200 designates the display panel. However, in FIG. 2 and the description of FIG. 2, the reference numeral 200 may designate a display module as well as the display panel. As shown in FIG. 2a, the LCD panel may include a liquid crystal layer 250 including a liquid crystal cell, a first glass layer 261 and a second glass layer 262 which are disposed on both sides of the liquid crystal layer 250 and include electrodes, a first polarizer layer 271 formed on a side of the first glass layer 201 in a direction facing the liquid crystal layer 250, and a second polarizer layer 272 formed on a side of the second glass layer 262 in the direction facing the liquid crystal layer 250. It is clear to those skilled in the art that the LCD panel may further include other configurations for the purpose of performing the displaying function and may be transformed.

FIG. 2a shows that the touch sensor panel 100 of the touch input device 1000 is disposed outside the display panel 200. The touch surface of the touch input device 1000 may be the surface of the touch sensor panel 100. In FIG. 2a, the top surface of the touch sensor panel 100 is able to function as the touch surface. Also, according to the embodiment, the touch surface of the touch input device 1000 may be the outer surface of the display panel 200. In FIG. 2a, the bottom surface of the second polarizer layer 272 of the display panel 200 is able to function as the touch surface. Here in order to protect the display panel 200, the bottom surface of the display panel 200 may be covered with a cover layer (not shown) like glass.

FIGS. 2a and 2c show that the touch sensor panel 100 of the touch input device 1000 is disposed inside the display panel 200. Here, in FIG. 2b, the touch sensor panel 100 for detecting the touch position is disposed between the first glass layer 261 and the first polarizer layer 271. Here, the touch surface of the touch input device 1000 is the outer surface of the display panel 200. The top surface or bottom surface of the display panel 200 in FIG. 2b may be the touch surface. FIG. 2c shows that the touch sensor panel 100 for detecting the touch position is included in the liquid crystal layer 250. Here, the touch surface of the touch input device 1000 is the outer surface of the display panel 200. The top surface or bottom surface of the display panel 200 in FIG. 2c may be the touch surface. In FIGS. 2b and 2c, the top surface or bottom surface of the display panel 200, which can be the touch surface, may be covered with a cover layer (not shown) like glass.

The foregoing has described whether the touch has occurred on the touch sensor panel 100 according to the embodiment of the present or not and where the touch has occurred. Further, through use of the touch sensor panel 100 according to the embodiment of the present, it is possible to detect the magnitude of the touch pressure as welt as whether the touch has occurred or not and where the touch has occurred. Also, apart from the touch sensor panel 100. It is possible to detect the magnitude of the touch pressure by further including the pressure detection module which detects the touch pressure.

Figure 3:
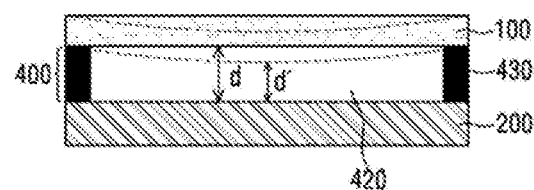
FIG. 3 is a cross sectional view of the touch input device configured to detect the touch position and touch pressure in accordance with the embodiment of the present invention.

FIG. 3 is a cross sectional view of the touch input device configured to detect the touch position and touch pressure in accordance with the embodiment of the present invention.

In the touch input device 1000 including the display panel 200, the touch sensor panel 100 and the pressure detection module 400 which detect the touch position may be attached on the front side of the display panel 200. As a result, the display screen of the display panel 200 can be protected and the touch detection sensitivity of the touch sensor panel 100 can be improved.

Here, the pressure detection module 400 may be operated apart from the touch sensor panel 100 which detects the touch position. For example, the pressure detection module 400 may be configured to detect only the touch pressure independently of the touch sensor panel 100 which detects the touch position. Also, the pressure detection module 400 may be configured to be coupled to the touch sensor panel 100 which detects the touch position and to detect the touch pressure. For example, at least one of the drive electrode TX and the receiving electrode RX included in the touch sensor panel 100 which detects the touch position may be used to detect the touch pressure.

FIG. 3 shows that the pressure detection module 400 is coupled to the touch sensor panel 100 and detects the touch pressure. In FIG. 3, the pressure detection module 400 includes a spacer layer 420 which leaves a space between the touch sensor panel 100 and the display panel 200. The pressure detection module 400 may include a reference potential layer spaced from the touch sensor panel 100 by the spacer layer 420. Here, the display panel 200 may function as the reference potential layer.

The reference potential layer may have any potential which causes the change of the capacitance 101 generated between the drive electrode TX and the receiving electrode RX. For instance, the reference potential layer may be a ground layer having a ground potential. The reference potential layer may be the ground layer of the display panel 200. Here, the reference potential layer may have a parallel plane with the two-dimensional plane of the touch sensor panel 100.

As shown in FIG. 3, the touch sensor panel 100 is disposed apart from the display panel 200, i.e., the reference potential layer. Here, depending on a method for adhering the touch sensor panel 100 to the display panel 200, the spacer layer 420 may be implemented in the form of an air gap between the touch sensor panel 100 and the display panel 200. The spacer layer 420 may be made of an impact absorbing material in accordance with the embodiment. Here, impact absorbing material may include sponge and a graphite layer. The spacer layer 420 may be filled with a dielectric material in accordance with the embodiment. This spacer layer 420 may be formed through a combination of the air gap, impact absorbing material, and dielectric material.

Here, a double adhesive tape (DAT) 130 may be used to fix the touch sensor panel 100 and the display panel 200. For example, the areas the touch sensor panel 100 and the display panel 200 are overlapped with each other. The touch sensor panel 100 and the display panel 200 are adhered to each other by adhering the edge portions of the touch sensor panel 100 and the display panel 200 through use of the DAT 430. The rest portions of the touch sensor panel 100 and the display panel 200 may be spaced apart from each other by a predetermined distance "d".

In general, even when the touch surface is touched without bending the touch sensor panel 100, the capacitance (Cm) 101 between the drive electrode TX and the receiving electrode RX is changed. That is, when the touch occurs on the touch sensor panel 100, the mutual capacitance (Cm) 101 may become smaller than a base mutual capacitance. This is because, when the conductive object like a finger approaches close to the touch sensor panel 100, the object functions as the ground GND, and then a fringing capacitance of the mutual capacitance (Cm) 101 is absorbed in the object. The base mutual capacitance is the value of the mutual capacitance between the drive electrode TX and the receiving electrode RX when there is no touch on the touch sensor panel 100.

When the object touches the top surface, i.e., the touch surface of the touch sensor panel 100 and a pressure is applied to the top surface, the touch sensor panel 100 may be bent. Here, the value of the mutual capacitance (Cm) 101 between the drive electrode TX and the receiving electrode RX may be more reduced. This is because the bend of the touch sensor panel 100 causes the distance between the touch sensor panel 100 and the reference potential layer to be reduced from "d" to "d'", so that the fringing capacitance of the mutual capacitance (Cm) 101 is absorbed in the reference potential layer as well as in the object. When a nonconductive object touches, the change of the mutual capacitance (Cm) 101 is simply caused by only the change of the distance "d-d'" between the touch sensor panel 100 and the reference potential layer.

As described above, the touch input device 1000 is configured to include the touch sensor panel 100 and the pressure detection module 400 on the display panel 200, so that not only the touch position but also the touch pressure can be simultaneously detected.

However, as shown in FIG. 3, when the pressure detection module 400 as well as the touch sensor panel 100 is disposed on the display panel 200, the display properties of the display panel is deteriorated. Particularly, when the air gap is included on the display panel 200, the visibility and optical transmittance of the display panel may be lowered.

Accordingly, in order to prevent such problems, the air gap is not disposed between the display panel 200 and the touch sensor panel 100 for detecting the touch position. Instead, the touch sensor panel 100 and the display panel 200 can be fully laminated by means of an adhesive like an optically clear adhesive (OCA).

Figure 4A:
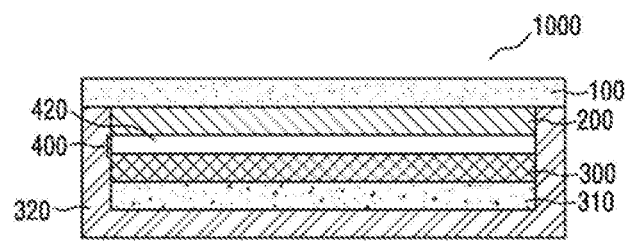
FIGS. 4a and 4e are cross sectional views of the touch input device according to the embodiment of the present invention.

FIG. 4a is a cross sectional view of the touch input device according to the embodiment of the present invention. In the touch input device 1000 according to the embodiment of the present invention, the full lamination may be made by an adhesive between the touch sensor panel 100 and the display panel 200 for detecting the touch position. As a result, the display color clarity, visibility and optical transmittance of the display panel 200, which can be recognized through the touch surface of the touch sensor panel 100, can be improved.

Figure 4B:
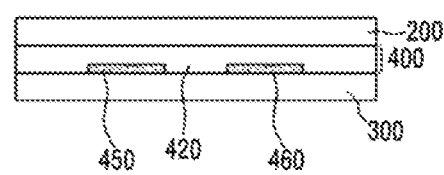
FIGS. 4b, 4c, and 4d are partial cross sectional views of the touch input device according to the embodiment of the present invention.
Figure 4C:
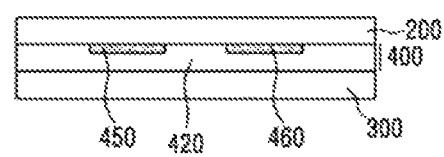
Figure 4D:
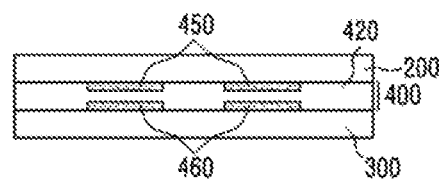
Figure 4E:
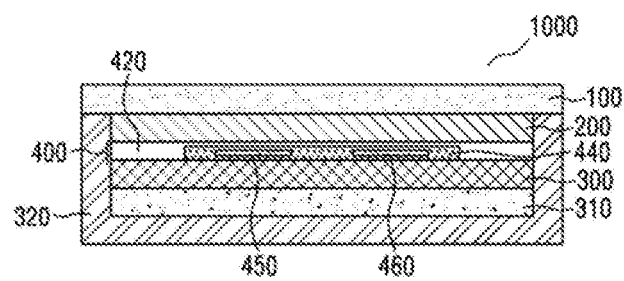

In FIGS. 4a and 4e and the description with reference to FIGS. 4a and 4e, it is shown that as the touch input device 1000 according to the second embodiment of the present invention, the touch sensor panel 100 is laminated and attached on the display panel 200 by means of an adhesive. However, the touch input device 1000 according to the second embodiment of the present invention may include, as shown in FIGS. 2b and 2c, that the touch sensor panel 100 is disposed inside the display panel 200. More specifically, while FIGS. 4a and 4e show that the touch sensor panel 100 covers the display panel 200, the touch input device 1000 which includes the touch sensor panel 100 disposed inside the display panel 200 and includes the display panel 200 covered with a cover layer like glass may be used as the second embodiment of the present invention.

The touch input device 1000 according to the embodiment of the present invention may include an electronic device including the touch screen, for example, a cell phone, a personal data assistant (PDA), a smart phone, a tablet personal computer, an MP3 player, a laptop computer, etc.

In the touch input device 1000 according to the embodiment of the present invention, a substrate 300, together with an outermost cover 320 of the touch input device 1000, functions as for example, a housing which surrounds a mounting space 310, etc., where the circuit board and/or battery for operation of the touch input device 1000 are placed. Here, the circuit board for operation of the touch input device 1000 may be a main board. A central processing unit (CPU), an application processor (AP) or the like may be mounted on the circuit board. Due to the substrate 300, the display panel 200 is separated from the circuit board and/or battery for operation of the touch input device 1000. Due to the substrate 300, electrical noise generated from the display panel 200 can be blocked.

The touch sensor panel 100 or front cover layer of the touch input device 1000 may be formed wider than the display panel 200, the substrate 300, and the mounting space 310. As a result, the cover 320 is formed such that the cover 320, together with the touch sensor panel 100, surrounds the display panel 200, the substrate 300, and the mounting space 310 in which the circuit board is located.

The touch input device 1000 according to the embodiment of the present may detect the touch position through the touch sensor panel 100 and may detect the touch pressure by disposing the pressure detection module 400 between the display panel 200 and the substrate 300. Here, the touch sensor panel 100 may be disposed inside or outside the display panel 200. The pressure detection module 400 may, for example, include electrodes 450 and 460.

The electrodes 450 and 460 may be, as shown in FIG. 4b, formed on the substrate 300 or may be, as shown in FIG. 4c formed on the display panel 200, or may be, as shown in FIG. 4d, formed on both the display panel 200 and the substrate 300.

Also, as shown in FIG. 4e, the electrodes 450 and 460 included in the pressure detection module 400 may be included in the touch input device 1000 in the form of an electrode sheet 440 including the electrode. This will be described below in detail. Here, since the electrodes 450 and 460 should be configured to include the air gap between the substrate 300 and the display panel 200, FIG. 4e shows that the electrode sheet 440 including the electrodes 450 and 460 is disposed apart from the substrate 300 and the display panel 200.

Figure 4F:
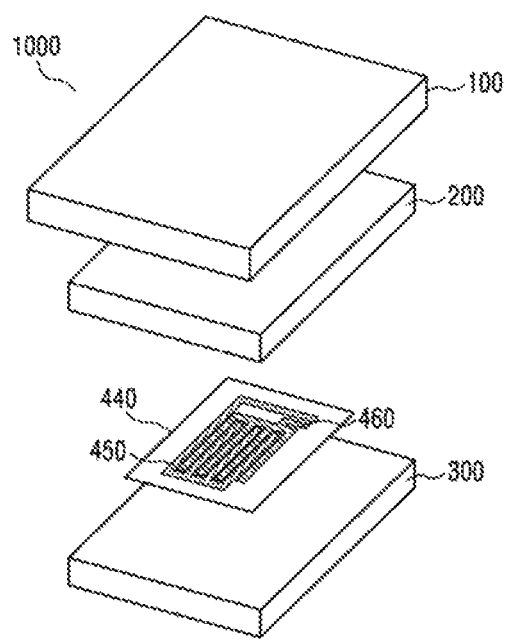
FIG. 4f is a perspective view of the touch input device according to the embodiment of the present invention.

FIG. 4g is a perspective view of the touch input device according to the embodiment of the present invention. As shown in FIG. 4f, in the touch input device 1000 according to the embodiment of the present invention, the pressure detection module 400 may be located between the display panel 200 and the substrate 300 and may include the electrodes 450 and 460. Hereafter in order to clearly distinguish between the electrodes 450 and 460 and the electrode included in the touch sensor panel 100, the electrodes 450 and 460 for detecting the pressure are designated as a pressure electrode. Here, since the pressure electrodes are disposed under the display panel instead of on the display panel, the pressure electrodes may be made of an opaque material as well as a transparent material.

Figure 5A:
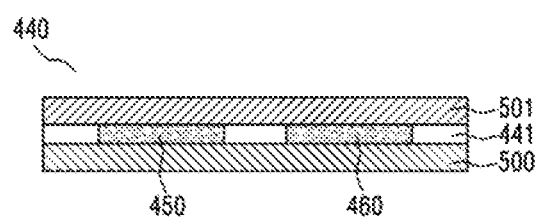
FIG. 5a is a cross sectional view of an illustrative electrode sheet including a pressure electrode to be attached to the touch input device according to the embodiment of the present invention.

FIG. 5a is an illustrative cross sectional view of the electrode sheet including the pressure electrode to be attached to the touch input device according to the embodiment of the present invention. For example, the electrode sheet 440 may include an electrode layer 441 between a first insulation layer 500 and a second insulation layer 501. The electrode layer 441 may include the first electrode 450 and/or the second electrode 460. Here, the first insulation layer 500 and the second insulation layer 501 may be made of an insulating material like polyimide. Polyethylene Terephthalate (PET), etc. The first electrode 450 and the second electrode 460 included in the electrode layer 441 may include a material like copper, aluminum (Al), silver (Ag), etc. According to the manufacturing process of the electrode sheet 440, the electrode layer 441 and the second insulation layer 501 may be bonded to each other by an adhesive (not shown) like art optically clear adhesive (OCA). Also, according to the embodiment, the pressure electrodes 450 and 460 may be formed by positioning a mask, which has a through-hole corresponding to a pressure electrode pattern, on the first insulation layer 500, and then by spraying a conductive material or by printing the conductive material, or by applying a metallic material and etching. It is shown in FIG. 5 and the following description that the electrode sheet 440 has a structure including the pressure electrodes 450 and 460 between the insulation layers 500 and 501. However, this is just an example, and it can be considered that the electrode sheet 440 has only the pressure electrodes 450 and 460.

In order that the touch pressure is detected in the touch input device 1000 according to the embodiment of the present invention, the electrode sheet 440 may be attached to either the substrate 300 or the display panel 200 in such a manner that either the substrate 300 or the display panel 200 and the electrode sheet 440 are spaced apart from each other to have the spacer layer 420 placed therebetween.

Figure 5B:
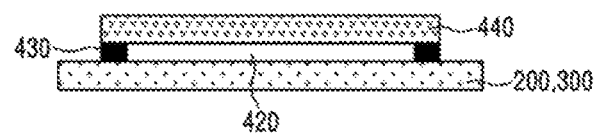
FIG. 5b is a partial cross sectional view of the touch input device to which the electrode sheet has been attached according to a first method.

FIG. 5b is a partial cross sectional view of the touch input device to which the electrode sheet has been attached according to a first method. FIG. 5b shows that the electrode sheet 440 has been attached on the substrate 300 or the display panel 200.

Figure 5C:
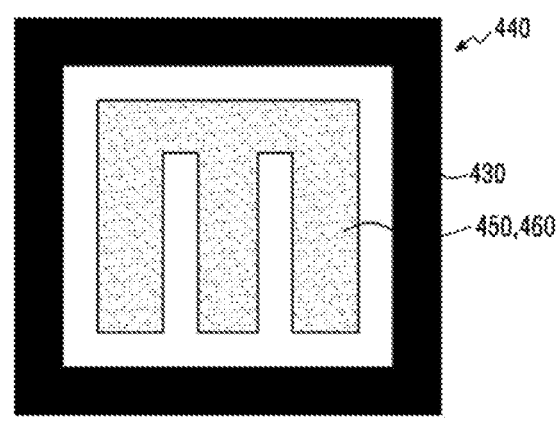
FIG. 5c is a plan view of the electrode sheet to be attached to the touch input device in accordance with the first method.

As shown in FIG. 5c, the adhesive tape 430 having a predetermined thickness may be formed along the border of the electrode sheet 440 so as to maintain the spacer layer 420. Though FIG. 5c shows that the adhesive tape 430 is formed along the entire border (for example, four sides of a quadrangle) of the electrode sheet 440, the adhesive tape 430 may be formed only on at least a portion (for example, three sides of a quadrangle) of the horde of the electrode sheet 440. Here, as shown in FIG. 5c, the adhesive tape 430 may not be formed on an area including the pressure electrodes 450 and 460. As a result, when the electrode sheet 440 is attached to either the substrate 300 or the display panel 200 through the adhesive tape 430, the pressure electrodes 450 and 460 may be spaced apart from either the substrate 300 or the display panel 200 at a predetermined distance. According to the embodiment, the adhesive tape 430 may be formed on the top surface of the substrate 300 or on the bottom surface of the display panel 200. Also, the adhesive tape 430 may be a double adhesive tape. FIG. 5c shows only one of the pressure electrodes 450 and 460.

Figure 5D:
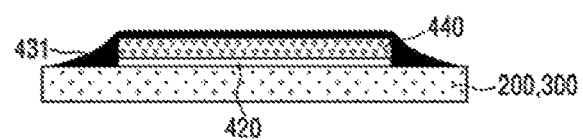
FIG. 5d is a partial cross sectional view of the touch input device to which the electrode sheet has been attached according to a second method.

FIG. 5d is a partial cross sectional view of the touch input device to which the electrode sheet has been attached according to a second method. In FIG. 5d, after the electrode sheet 440 is placed on either the substrate 300 or the display panel 200, the electrode sheet 440 may be fixed to either the substrate 300 or the display panel 200 by means of the adhesive tape 430. For this, the adhesive tape 430 may come in contact with at least, a portion of the electrode sheet 440 and at least a portion of either the substrate 300 or the display panel 200. FIG. 5d shows that, the adhesive tape 430 continues from the top of the electrode sheet 440 to the exposed surface of either the substrate 300 or the display panel 200. Here, only a portion of the adhesive tape 430, which contacts with the electrode sheet 440, may base adhesive strength. Therefore, in FIG. 5d, the top surface of the adhesive tape 430 may not have the adhesive strength.

As shown in FIG. 5d, even if the electrode sheet 440 is fixed to either the substrate 300 or the display panel 200 by using the adhesive tape 430, a predetermined space, i.e., air gap may be created between either the substrate 300 or the display panel 200 and the electrode sheet 440. This is because either the substrate or the display panel 200 are not directly attached to the electrode sheet 440 by means of the adhesive and because the electrode sheet 440 includes the pressure electrodes 450 and 460 has rag a pattern, so that the surface of the electrode sheet 440 may not be flat. The air gap of FIG. 5d may also function as the spacer layer 420 for detecting the touch pressure.

Hereafter, the description of the embodiments of the present invention take an example of a case where the electrode sheet 440 is attached to either the substrate 300 or the display panel 200 by the first method shown in FIG. 3d. However, the description can be applied to a case where the electrode sheet 440 is attached and spaced from the substrate 300 or the display panel 200 by any method like the second method, etc.

Hereafter, the embodiment of the present invention describes the pressure detection module 400 shown in FIG. 4b.

When a pressure is applied to the touch sensor panel 100 through an object, the distance between the display panel 200 and the substrate 300 may be changed, and thus, the capacitance detected at the pressure electrode may be changed.

Specifically, the pressure electrodes 450 and 460 may be comprised of a single electrode or may include the first electrode and the second electrode. When the pressure electrode is comprised of a single electrode, the pressure electrode may be disposed inside or outside the display panel 200 or the distance between the single electrode and the reference potential layer included in the display panel 200 itself becomes smaller. Accordingly, the capacitance change amount of own single electrode is changed, thereby detecting the magnitude of the touch pressure. When the pressure electrodes 450 and 460 include the first electrode and the second electrode, one of the first and second electrodes may be a drive electrode and the other may be a receiving electrode. A driving signal is applied to the drive electrode and a sensing signal can be obtained through the receiving electrode. When a pressure is applied to the touch sensor panel 100 by the object, the pressure electrode is disposed inside or outside the display panel 200 or the distance between the first and second electrodes and the reference potential layer included in the display panel 200 itself becomes smaller. Accordingly, the capacitance change amount between the first electrode and the second electrode is changed, thereby detecting the magnitude of the touch pressure.

The display panel 200 may include a first area and a second area. Specifically, the first area may be a central area of the display panel 200, and the second area may be an edge area of the display panel 200. Here, the central area of the display panel 200, i.e., the first area may have a certain size with respect to the central point of the surface of the touch sensor panel 100. Also, the edge area of the display panel 200, i.e., the second area may correspond to the remaining area other than the central area of the surface of the touch sensor panel 100.

When a pressure is applied to the touch sensor panel by the object, how much the touch sensor panel 100 and the display panel 200 are curved changes according to where the pressure is applied. Therefore, even if the pressures having the same magnitude are applied, the magnitudes of the touch pressures may be detected differently front each other according to the position to which the pressure has been applied.

Figure 6A:
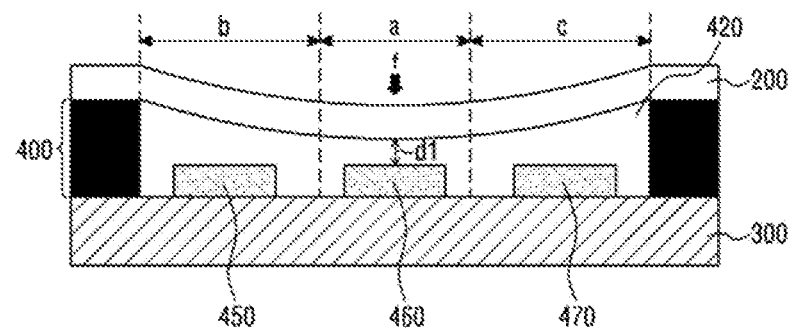
FIGS. 6a and 6b are partial cross sectional views of the touch input device according to the first embodiment of the present invention.
Figure 6B:
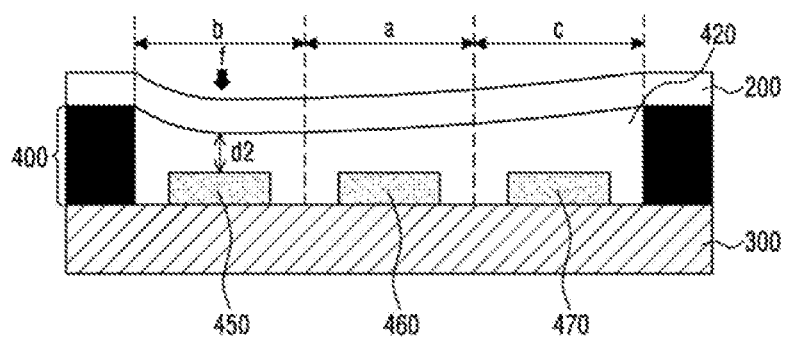

For example, as shown in FIGS. 6a and 6b, in the touch input device 1000 according to a first embodiment of the present invention, when a pressure is applied to the display panel 200, the first area "a" of the display panel 200 may be more curved than the second area "b" or "c". Therefore, the distance "d2" between the display panel 200 and the pressure electrode 450 or 470 disposed under the second area or "b" or "c" in a case where pressures having the same magnitude are applied to the second area "b" or "c" of the display panel 200 may be larger than the distance "d1" between the display panel 200 and the pressure electrode 460 disposed under the first area "a" in a case where the pressure is applied to the first area "a".

In other words, as shown in FIGS. 6a and 6b, the pressure electrodes are formed on the substrate 300 to have the same width at a regular interval. In a case where the pressure electrodes are spaced apart from the reference potential layer at the same distance and are formed to have the same material composition as that of the reference potential layer, even though the pressures having the same magnitude are applied, the capacitance change amount detected in the second area "b" or "c" of the display panel 200 is larger than the capacitance change amount detected in the first area of the display panel 200.

Therefore, in the embodiment of the present invention, when the object applies pressures having the same magnitude to the touch sensor panel 100, in order to detect the touch pressures having the same magnitude irrespective of where the pressure is applied, there is a necessity to arrange the pressure electrodes such that the capacitance change amount, detected in the second area "b" or "c" of the display panel 200 is larger than the capacitance change amount detected in the first area "a" of the display panel 200.

In other words, when a pressure is applied to the touch sensor panel 100, the distance between the display panel 200 and the substrate 300 changes, and under a same distance change condition, there is a necessity to arrange the pressure electrodes such that the capacitance change amount detected at the pressure electrode disposed under the second area of the display panel 200 is larger than the capacitance change amount detected at the pressure electrode disposed under the first area of the display panel 200.

Regarding the pressure detection module 400 shown in FIG. 4b, the reference potential layer may be disposed inside or outside the display panel 200 or may be included in the display panel 200 itself. There is a necessity to arrange the pressure electrodes such that the capacitance change amount which is detected at the pressure electrode disposed under the second area in accordance with the distance change between the reference potential layer and the pressure electrode disposed under the second area is larger than the capacitance change amount which is detected at the pressure electrode disposed under the first area in accordance with the distance change which occurs between the reference potential layer and the pressure electrode disposed under the first area and is same with the distance change between the reference potential layer and the pressure electrode disposed under the second area.

Likewise, regarding the pressure detection module 400 shown in FIG. 4c, the reference potential layer may be disposed inside or outside the substrate 300 or may be included in the substrate 300 itself. There is a necessity to arrange the pressure electrodes such that the capacitance change amount which is detected at the pressure electrode disposed under the second area in accordance with the distance change between the reference potential layer and the pressure electrode disposed under the second area is larger than the capacitance change amount which is detected at the pressure electrode disposed under the first area in accordance with the distance change which occurs between the reference potential layer and the pressure electrode disposed under the first area and is same with the distance change between the reference potential layer and the pressure electrode disposed under the second area.

Also, regarding the pressure detection module 400 shown in FIG. 4d, there is a necessity to arrange the pressure electrodes such that the capacitance change amount which is detected at the pressure electrode disposed under the second area in accordance with the change of distance between the pressure electrode formed on the substrate 300 and the pressure electrode formed on the display panel 200 is larger than the capacitance change amount which is detected at the pressure electrode disposed under the first area in accordance with the change of the distance which occurs between the pressure electrode formed on the substrate 300 and the pressure electrode formed on the display panel 200 and is same with the distance change between the reference potential layer and the pressure electrode disposed under the second area.

Figure 7A:
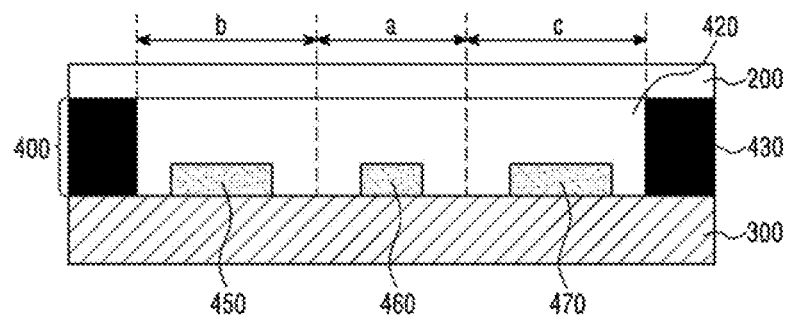
FIGS. 7a, 7b, 7c, 7d, 7e, and 7f are partial cross sectional views of the touch input device according to the second embodiment of the present invention.

Specifically, in order that the capacitance change amount detected in the second area "b" or "c" of the display panel 200 is larger than the capacitance change amount detected in the first area "a" of the display panel 200, as shown in FIG. 7a in accordance with a first method of a second embodiment of the present invention, the width of the pressure electrode 460 disposed under the first area "a" may be less than the width of the pressure electrode 450 or 470 disposed under the second area "b" or "c".

Figure 7B:
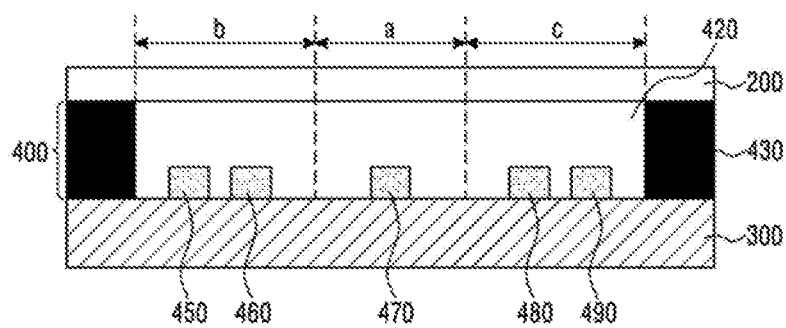

As shown in FIG. 7b according to a second method, the distance between the pressure electrode 470 disposed under the first area "a" and the pressure electrode adjacent to the pressure electrode 470 may be greater than the distance between the pressure electrode 450, 460, 480, or 490 disposed under the second area "b" or "c" and the electrode adjacent thereto.

Figure 7C:
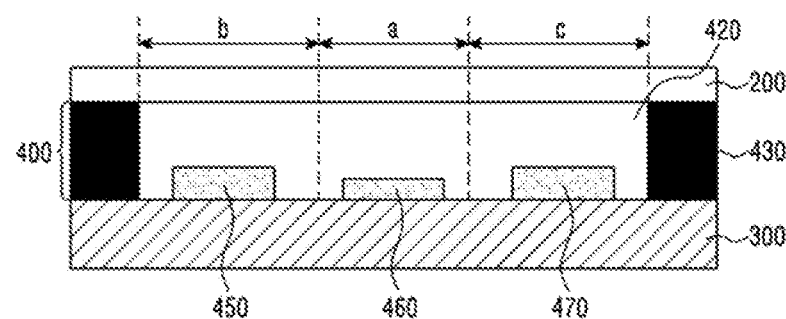

As shown in FIG. 7c according to a third method, the distance between the reference potential layer and the pressure electrode 460 disposed under the first area "a" may be greater than the distance between the reference potential layer and the pressure electrode 450 or 470 disposed under the second area "b" or "c".

Figure 7D:
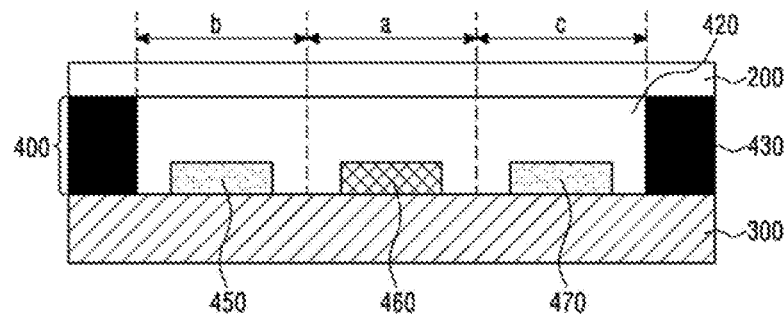

As shown in FIG. 7d according to a fourth method, the material composition constituting the pressure electrode 460 disposed under the first area "a" may be different from the material composition constituting the pressure electrode 450 or 470 disposed under the second area "b" or "c".

The foregoing has described the embodiment in which, when the presume electrode is comprised of a single electrode, the capacitance change amount detected in the first area "a" of the display panel 200 is greater than the capacitance change amount detected in the second area "b" or "c" in accordance with the first to fourth methods. An embodiment in which, when the pressure electrode includes the first electrode and the second electrode, the capacitance change amount detected in the second area "b" or "c" of the display panel 200 is greater than the capacitance change amount detected in the first area "a" will be described with reference to FIGS. 7e to 7f.

Figure 7E:
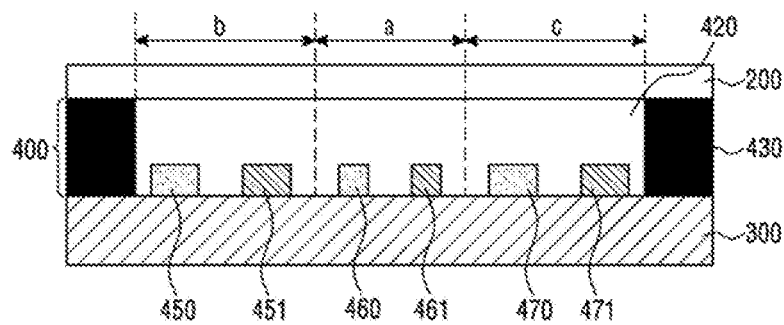

As shown in FIG. 7e according to the first method, when the pressure electrode is comprised of the first electrodes 450, 460, and 470 and the second electrodes 451, 461, and 471, the widths of the first electrode 460 and the second electrode 461 which are disposed under the first area "a" may be less than the widths of the first electrode 450 or 470 and the second electrode 451 or 471 which are disposed under the second area "b" or "c".

Figure 7F:
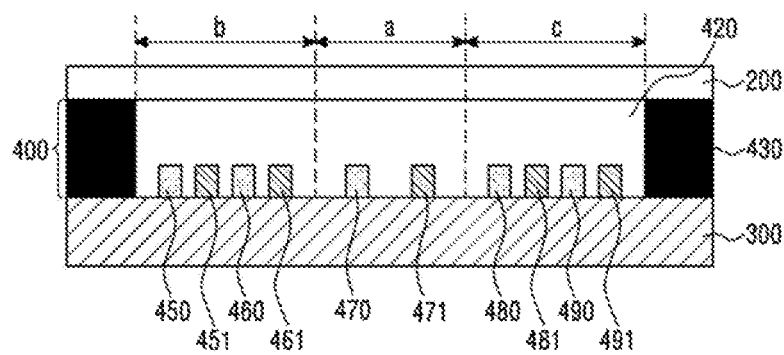

As shown in FIG. 7f according to the second method, when the pressure electrode is comprised of the first electrodes 450, 460, 470, and 480 and the second electrodes 451, 461, 471, and 481, the distance between a pair of the first and second electrodes 470 and 471 disposed under the first area "a" and a pair of electrodes adjacent to the pair of first and second electrodes 470 and 471 may be larger titan the distance between a pair of the first and second electrodes 450 and 451, 460 and 461, 480 and 481, or 490 and 401 disposed under the second area "b" or "c" and a pair of electrodes adjacent thereto.

Also, when the pressure electrode includes, as described above, the first electrode and the second electrode, the capacitance change amount detected in the second area "b" or "c" may be intended to be greater than the capacitance change amount detected in the first area in accordance with the third and fourth methods. Since this is similar to the description of FIGS. 7c and 7d, the detailed description thereof will be omitted.

Figure 8A:
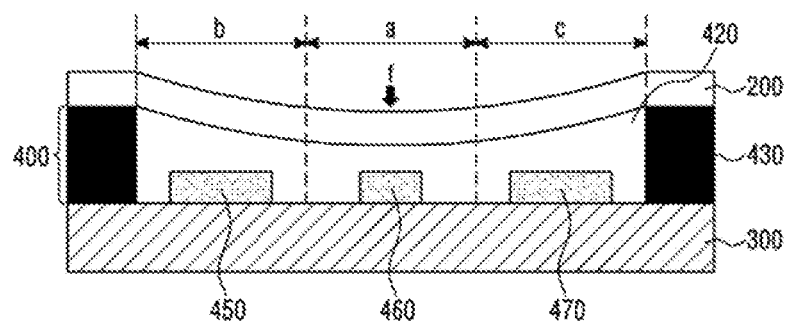
FIGS. 8a and 8b are cross sectional views when a pressure is applied to the touch input device shown in FIG. 7a in accordance with the first method in the embodiment of the present invention.
Figure 8B:
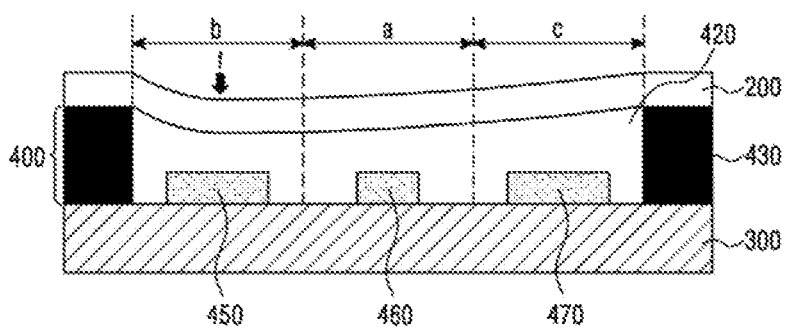

FIGS. 8a and 8b are cross sectional views when a pressure is applied to the touch input device shown in FIG. 7a in accordance with the first method in the embodiment of the present invention.

FIGS. 8a and 8b show that the width of the pressure electrode 400 disposed under the first area is less than the width of the pressure electrode 450 or 470 disposed under the second area "b" or "c". Accordingly, when the object applies, as shown in FIG. 8a, a pressure "f" to the first area "a", the distance between the reference potential layer and the pressure electrodes becomes smaller and the capacitance change amount is obtained, so that the magnitude of the touch pressure applied to the first area "a" can be detected. Also, when the object applies, as shown in FIG. 8b, the pressure "f" to the second area "b", the distance between the reference potential layer and the pressure electrodes becomes smaller and the capacitance change amount is obtained, so that the magnitude of the touch pressure applied to the second area "b" can be detected. In this case, since the width of the pressure electrode disposed under the second area "b" is greater than the width of the pressure electrode disposed under the first area "a", the capacitance change amount detected in the second area "b" may be greater than the capacitance change amount detected in the first area "a". Therefore, even though the distance between the reference potential layer and the pressure electrode disposed under the first area "a" is less than the distance between the reference potential layer and the pressure electrode disposed under the second area "b", the capacitance change amount in the second area "b" and the capacitance channel amount in the first area "a" may be the same as each other for the pressure having the same magnitude. Accordingly, the magnitude of the touch pressure detected in the first area "a" may be the same as the magnitude of the touch pressure detected in the second area "b". Here, when a difference between the magnitude of the pressure detected in the first area "a" and the magnitude of the pressure detected in the second area "b" is included within a certain range, the pressures can be determined to have the same magnitude.

Figure 8C:
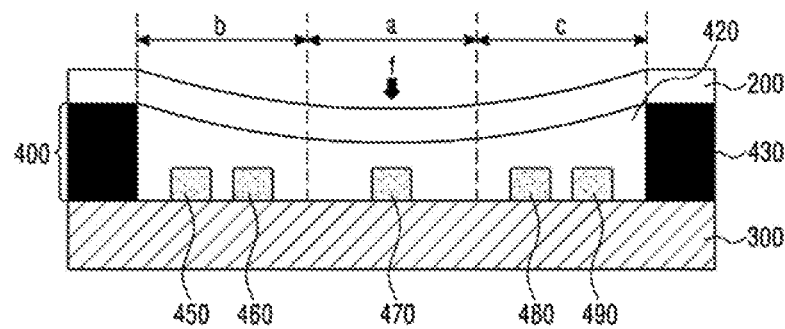
FIGS. 8c and 8d are cross sectional views when a pressure is applied to the touch input device shown in FIG. 7b in accordance with the second method in the embodiment of the present invention.
Figure 8D:
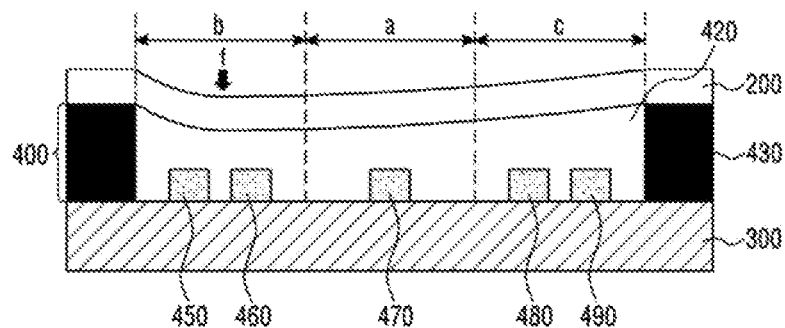

FIGS. 8c and 8d are cross sectional views when a pressure is applied to the touch input device shown in FIG. 7b in accordance with the second method in the embodiment of the present invention.

FIGS. 8c and 8d show that the distance between the pressure electrode 470 disposed under the first area "a" and the pressure electrode adjacent to the pressure electrode 470 is greater than the distance between the pressure electrode 450, 460, 480, or 490 disposed under the second area "b" or "c" and the electrode adjacent thereto. Accordingly, when the object applies, as shown in FIG. 8c, a pressure "f" to the first area "a", the distance between the reference potential layer and the pressure electrodes becomes smaller and the capacitance change amount is obtained, so that the magnitude of the touch pressure applied to the first area "a" can be detected. Also, when the object applies, as shown in FIG. 8d, the pressure "f" to the second area "b", the distance between the reference potential layer and the pressure electrodes becomes smaller and the capacitance change amount is obtained, so that the magnitude of the touch pressure applied to the second area "b" can be detected. In this case, since the distance between the pressure electrode disposed under the second area "b" and the pressure electrode adjacent thereto is less than the distance between the pressure electrode disposed under the first area "a" and the pressure electrode adjacent thereto, the capacitance change amount detected in the second area "b" may be greater than the capacitance change amount detected in the first area "a". Therefore, even though the distance between the reference potential layer and the pressure electrode disposed under the first area "a" is less than the distance between the reference potential layer and the pressure electrode disposed under the second area "b", the capacitance change amount in the second area "b" and the capacitance change amount in the first area "a" may be the same as each other for the pressure having the same magnitude. Accordingly, the magnitude of the touch pressure detected in the first area "a" may be the same as the magnitude of the touch pressure detected in the second area "b".

Figure 8E:
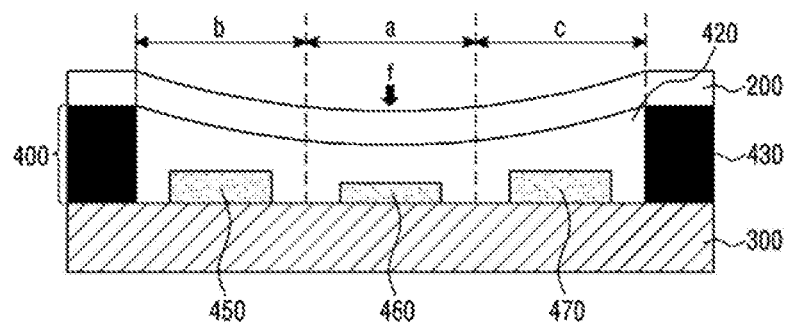
FIGS. 8e and 8h are cross sectional views when a pressure is applied to the touch input device shown in FIG. 7c in accordance with a third method in the embodiment of the present invention.
Figure 8F:
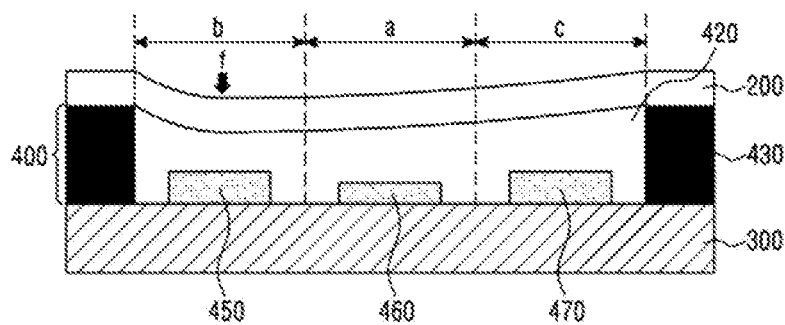

FIGS. 8e and 8f are cross sectional views when a pressure is applied to the touch input device shown in FIG. 7c in accordance with the third method in the embodiment of the present invention.

FIGS. 8e and 8f show that the distance between the reference potential layer and the pressure electrode 460 disposed under the first area "a" is greater than the distance between the reference potential layer and the pressure electrode 450 or 470 disposed under the second area "b" or "c". Accordingly, when the object applies, as shown in FIG. 8e, a pressure "f" to the first area "a", the distance between the reference potential layer and the pressure electrodes becomes smaller and the capacitance change amount is obtained, so that the magnitude of the touch pressure applied to the first area "a" can be detected. Also, when the object applies, as shown in FIG. 8f, the pressure "f" to the second area "b", the distance between the reference potential layer and the pressure electrodes becomes smaller and the capacitance change amount between the pressure electrodes is obtained, so that the magnitude of the touch pressure applied to the second area "b" can be detected. In this case, since the distance between the reference potential layer and the pressure electrode disposed under the second area "b" when the pressure is not applied is less than the distance between the reference potential layer and the pressure electrode disposed under the first area "a", the capacitance change amount detected in the second area "b" may be greater than the capacitance change amount detected in the first area "a". Therefore, even though the distance between the reference potential layer and the pressure electrode disposed under the second area "b", which is reduced by the applied pressure, is less than the distance between the reference potential layer and the pressure electrode disposed under the first area "a", which is reduced by the applied pressure, the capacitance change amount in the second area "b" and the capacitance change amount in the first area "a" may be the same as each other for the pressure having the same magnitude. Accordingly, the magnitude of the touch pressure detected in the first area "a" may be the same as the magnitude of the touch pressure detected in the second area "b".

Figure 8G:
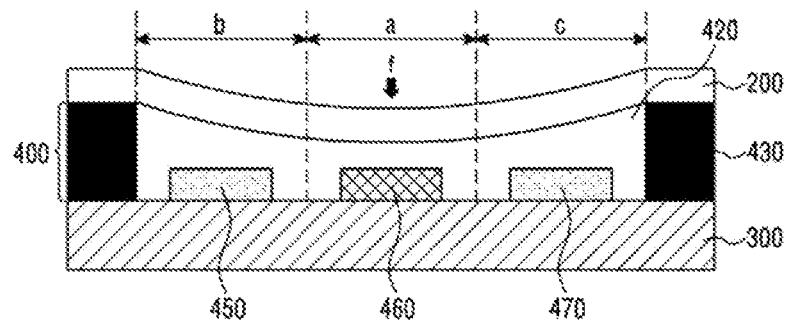
Figure 8H:
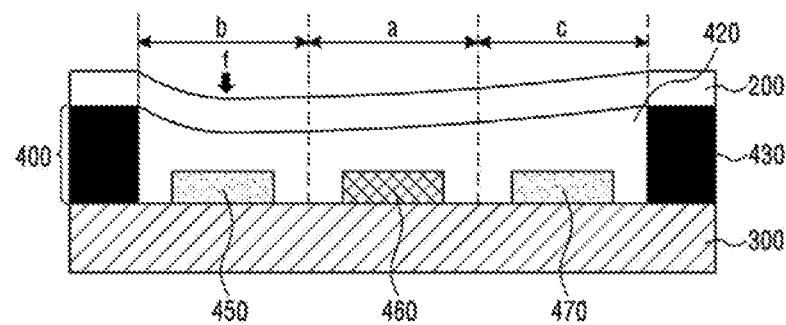

FIGS. 8g and 8h are cross sectional views when a pressure is applied to the touch input device shown in FIG. 7d in accordance with the fourth method in the embodiment of the present invention.

FIGS. 8g and 8h show that the material composition constituting the pressure electrode 460 disposed under the first area "a" is different from the material composition constituting the pressure electrode 450 or 470 disposed under the second area "b" or "c". For example, the material composition constituting the pressure electrode disposed under the second area "b" or "c" may be different from the material composition constituting the pressure electrode disposed under the first area "a" such that the capacitance change amount in the second area "b" or "c" is greater than the capacitance change amount in the first area "a" under the same condition. In this case, since the capacitance change amount in the second area "b" or "c" is greater than the capacitance change amount in the first area "a", the capacitance change amount detected in the second area "b" or "c" may be greater than the capacitance change amount detected in the first area "a". Therefore, even though the distance between the reference potential layer and the pressure electrode disposed under the first area "a" is less than the distance between the reference potential layer and the pressure electrode disposed under the second area "b", the capacitance change amount in the second area "b" and the capacitance change amount in the first area "a" may be the same as each other for the pressure having the same magnitude. Accordingly, the magnitude of the touch pressure detected in the first area "a" may be the same as the magnitude of the touch pressure detected in the second area "b".

Figure 8I:
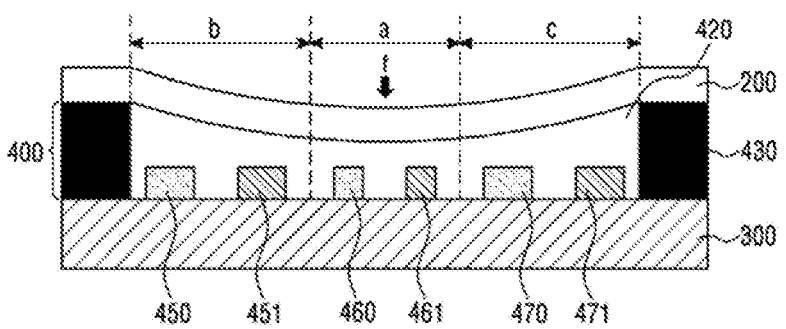
FIGS. 8i and 8j are cross sectional views when a pressure is applied to file touch input device shown in FIG. 7e in accordance with the first method in the embodiment of the present invention.
Figure 8J:
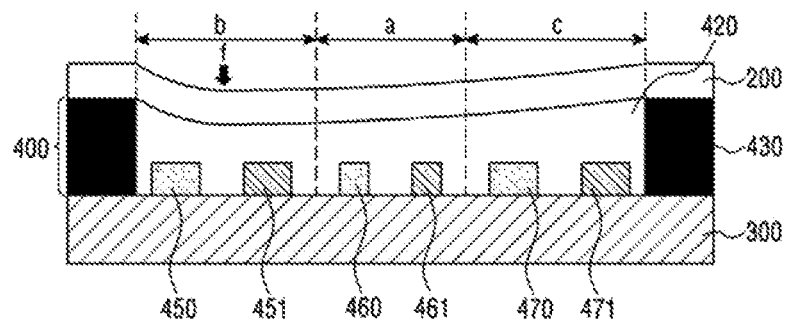

FIGS. 8i and 8j are cross sectional views when a pressure is applied to the touch input device shown in FIG. 7e in accordance with the first method in the embodiment of the present invention.

FIGS. 8i and 8j show that the widths of the first electrode 460 and the second electrode 461 which are disposed under the first area "a" are less than the widths of the first electrode 450 or 470 and the second electrode 451 or 471 which are disposed under the second area "b" or "c". Accordingly, when the object applies, as shown in FIG. 8i, a pressure "f" to the first area "a", the distance between the reference potential layer and the first and second electrodes becomes smaller and the capacitance change amount is obtained, so that the magnitude of the touch pressure applied to the first area "a" can be detected. Also, when the object applies, as shown in FIG. 8j, the pressure "f" to the second area "b", the distance between the reference potential layer and the first and second electrodes becomes smaller and the capacitance change amount is obtained, so that the magnitude of the touch pressure applied to the second area "b" can be detected. In this case, since the widths of the first and second electrodes disposed under the second area "b" are greater than the widths of the first and second electrodes disposed under the first area "a", the capacitance change amount detected in the second area "b" may be greater than the capacitance change amount detected in the first area "a". Therefore, even though the distance between she reference potential layer and the first and second electrodes disposed under the first area "a" is less than the distance between the reference potential layer and the first and second electrodes disposed under the second area "b", the capacitance change amount in the second area "b" and the capacitance change amount in the first area "a" may be the same as each other for the pressure having the same magnitude. Accordingly, the magnitude of the touch pressure detected in the first area "a" may be the same as the magnitude of the touch pressure detected in the second area "b".

Figure 8K:
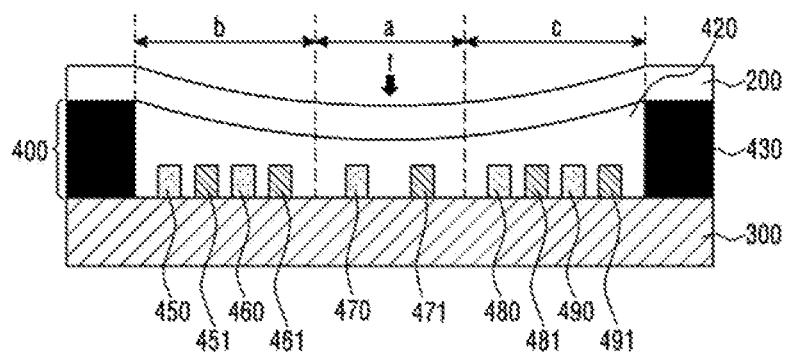
FIGS. 8k and 8l are cross sectional views when a pressure is applied to the touch input device shown in FIG. 7f in accordance with the second method in the embodiment of the present invention.
Figure 8L:
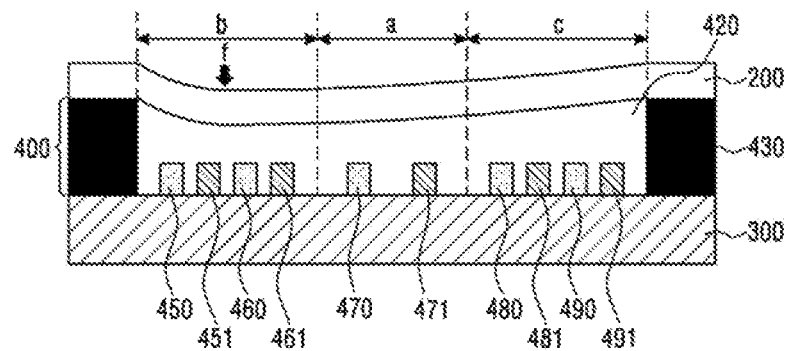

FIGS. 8k and 8l are cross sectional views when a pressure is applied to the touch input device shown in FIG. 7f in accordance with the second method in the embodiment of the present invention.

FIGS. 8k and 8l show that the distance between a pair of the first and second electrodes 470 and 471 disposed under the first area "a" and a pair of electrodes adjacent to the pair of first and second electrodes 470 and 471 is larger than the distance between a pair of the first and second electrodes 450 and 451, 460 and 461, 480 and 481, or 400 and 491 disposed under the second area "b" or "c" and a pair of electrodes adjacent thereto. Accordingly, when the object applies, as shown in FIG. 8k, a pressure "f" to the first area "a", the distance between the reference potential layer and the first and second electrodes becomes smaller and the capacitance change amount is obtained, so that the magnitude of the touch pressure applied to the first area "a" can be detected. Also, when the object applies, as shown in FIG. 8l, the pressure "f" to the second area "b", the distance between the reference potential layer and the first and second electrodes becomes smaller and the capacitance change amount is obtained, so that the magnitude of the touch pressure applied to the second area "b" can be detected. In this case, since the distance between the pair of the first and second electrodes disposed under the second area "b" and a pair of electrodes adjacent thereto is less than the distance between the pair of the first and second electrodes disposed under the first area "a" and a pair of electrodes adjacent thereto, the capacitance change amount detected in the second area "b" may be greater than the capacitance change amount detected in the first area "a". Therefore, even though the distance between the reference potential layer and the first and second electrodes disposed under the first area "a" is less than the distance between the reference potential layer and the first and second electrodes disposed under the second area "b", the capacitance change amount in the second area "b" and the capacitance change amount in the first area "a" may be the same as each other for the pressure having the same magnitude. Accordingly, the magnitude of the touch pressure detected in the first area "a" may be the same as the magnitude of the touch pressure detected in the second area "b".

Also, when the pressure electrode includes, as described above, the first electrode and the second electrode, the pressure is applied to the touch input device in accordance with the third and fourth methods. Since this is similar to the description of FIGS. 8e, 8f, 8f, and 8h, the detailed description thereof will be omitted.

In the pressure detection module 400 of the embodiment. FIGS. 6 to 8 show that the display panel 200 is spaced apart from the substrate 300 by the thickness of the adhesive tape 430. However, a portion of the display panel 200, which contacts with the adhesive tape 430, protrudes toward the substrate 300, or a portion of the substrate 300, which contacts with the adhesive tape 430, protrudes toward the display panel 200, so that the display panel 200 may be spaced apart from the substrate 300 by more than the thickness of the adhesive tape 430.

FIGS. 9 to 14 show the pressure electrodes which can be applied to the first and second embodiments of the present invention respectively.

Figure 9:
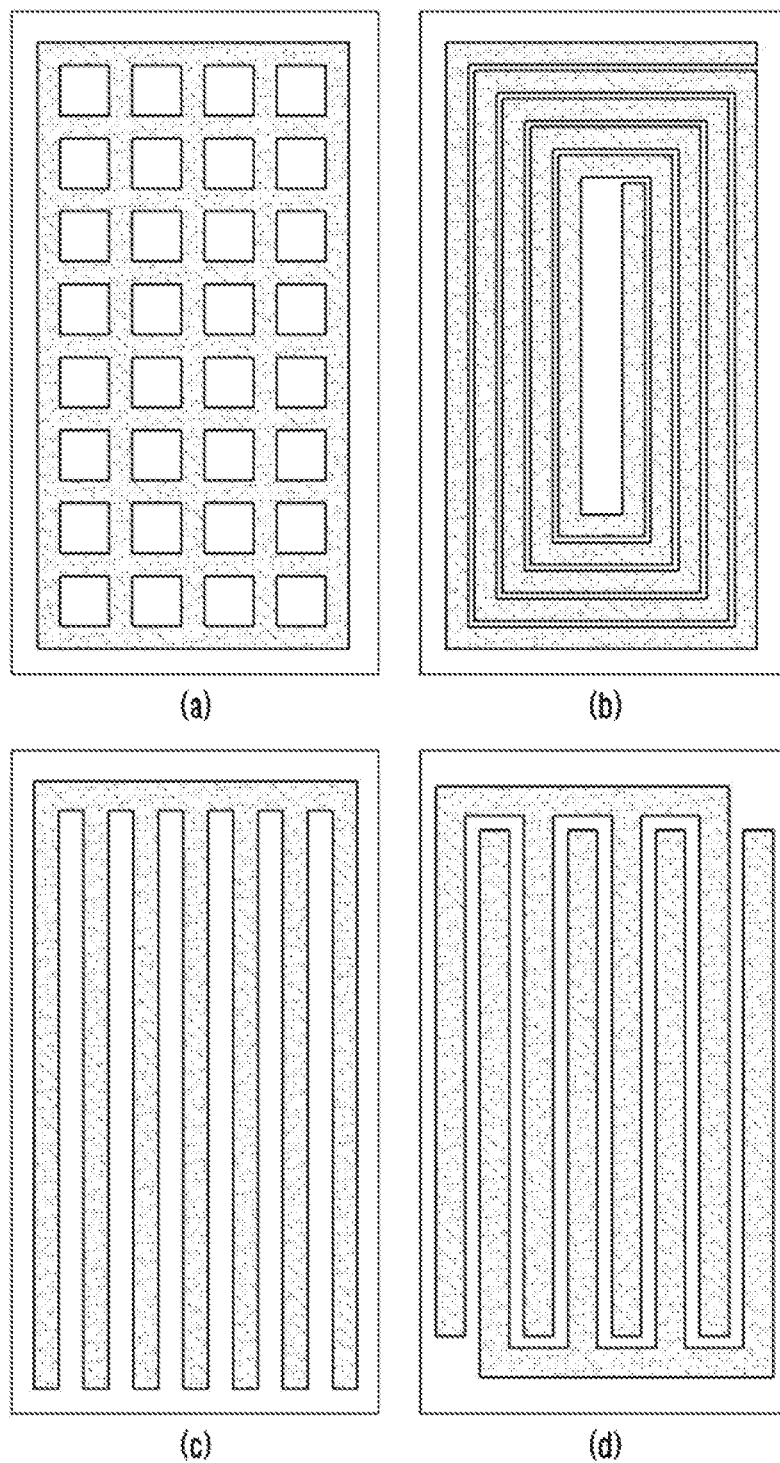

FIG. 9 shows a pressure electrode which can be applied to the first embodiment of the present invention.

According to the embodiment of the present invention, the pressure electrode may have a grid shape as shown in (a) of FIG. 9, or may have a swirling shape as shown in (b) of FIG. 9. Also, the pressure electrode may have a comb teeth shape as shown in (c) of FIG. 9, or may have a trident shape as shown in of FIG. 9.

Figure 10:
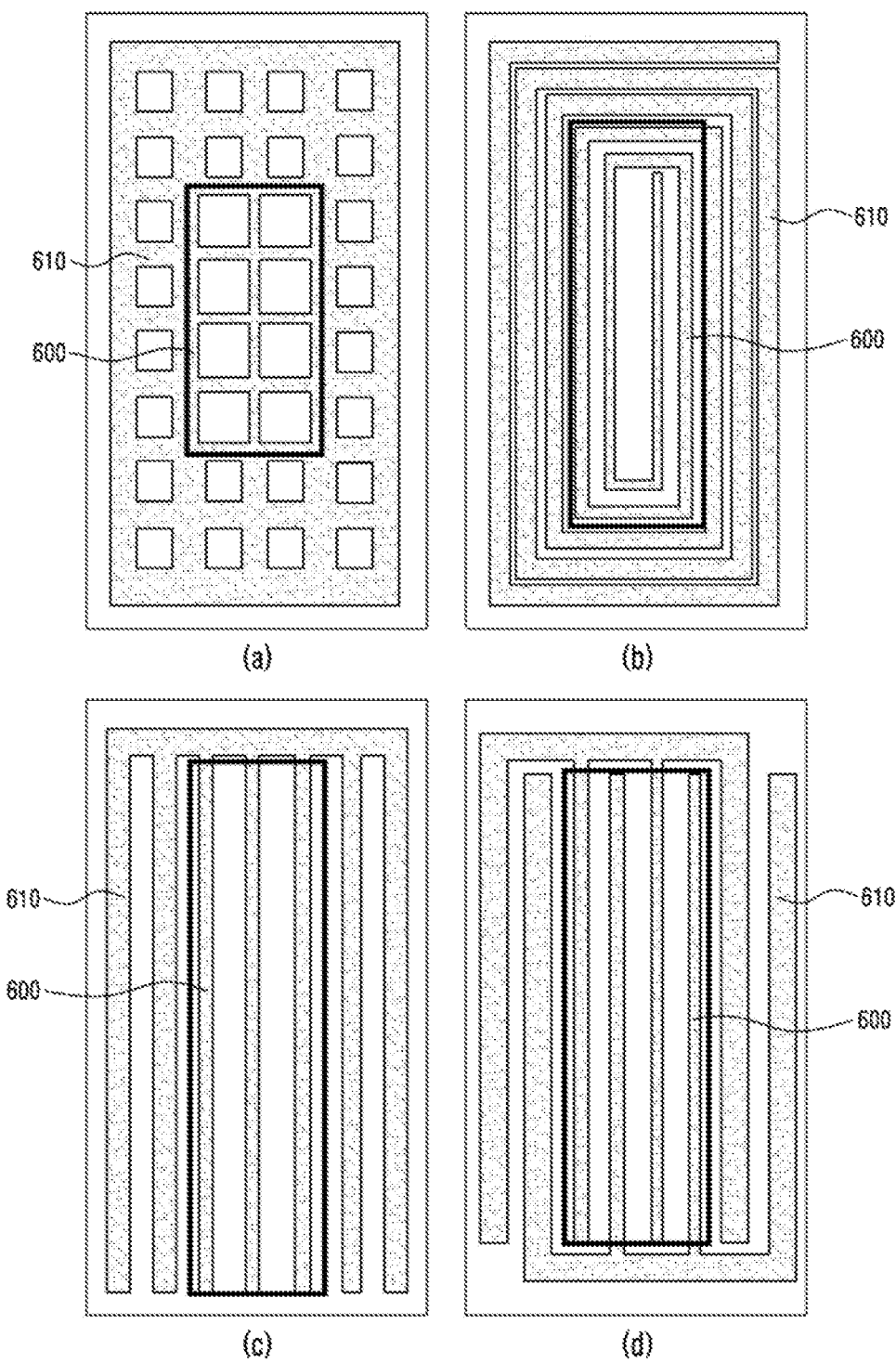

FIG. 10 shows a pressure electrode which can be applied to the first method in the second embodiment of the present invention.

According to the embodiment of the present invention, the pressure electrode may have a grid shape as shown in (a) of FIG. 10, or may have a swirling shape as shown in (b) of FIG. 10. Also, the pressure electrode may have a comb teeth shape as shown in (c) of FIG. 10, or may have a trident shape as shown in (d) of FIG. 10. In this case, the width of a pressure electrode 600 disposed under the first area of (a), (b), (c) and (d) of FIG. 10 may be less than the width of a pressure electrode 610 disposed under the second area. As a result, when the pressures having the same magnitude are applied, the magnitude of the touch pressure detected in the second area may be the same as the magnitude of the touch pressure detected in the first area.

Figure 11:
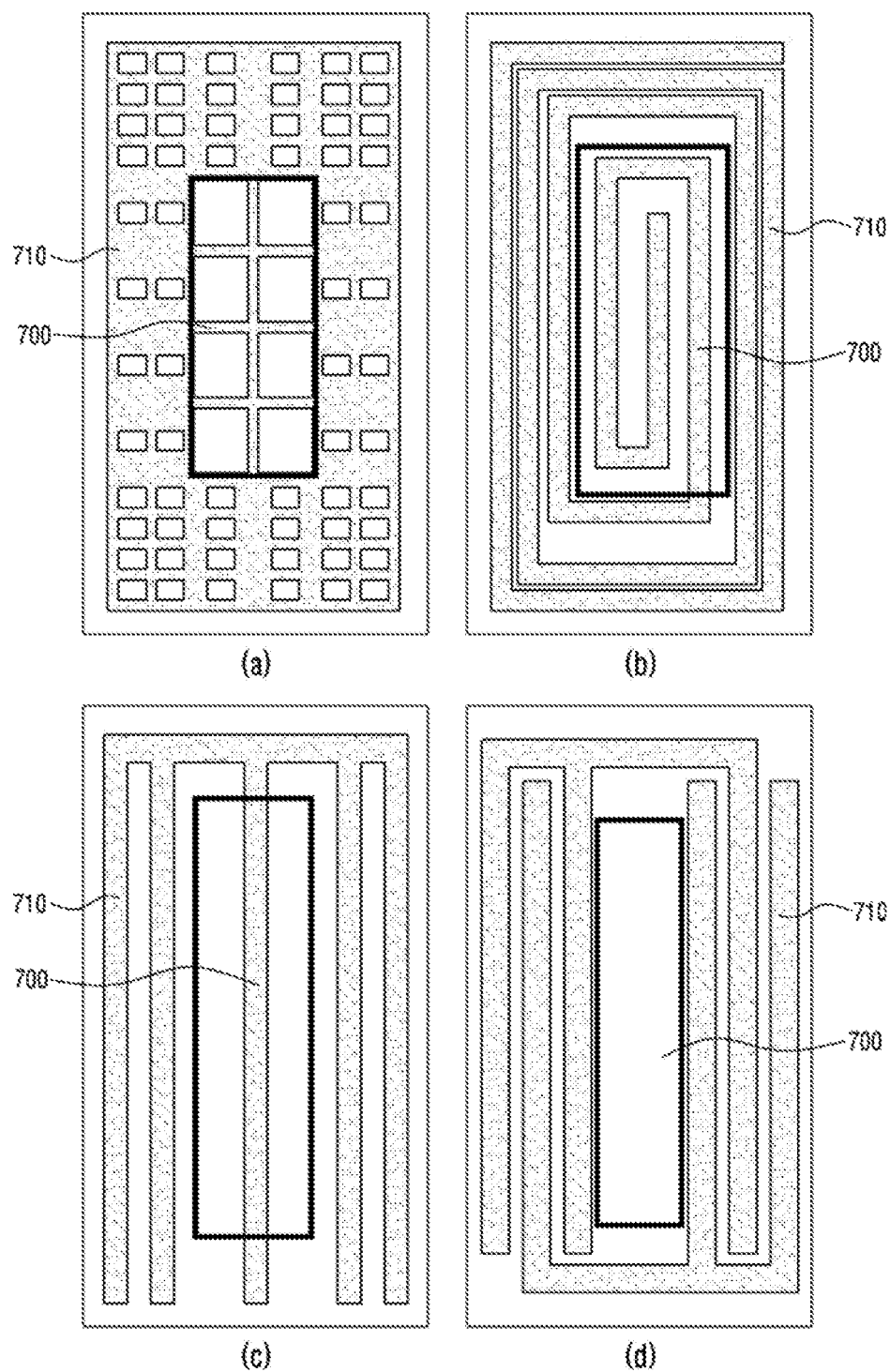

FIG. 11 shows a pressure electrode which can be applied to the second method in the second embodiment of the present invention.

According to the embodiment of the present invention, the pressure electrode may have a grid shape as shown in (a) of FIG. 11, or may have a swirling shape as shown in (b) of FIG. 11. Also, the pressure electrode may have a comb teeth shape as shown in (c) of FIG. 11, or may have a trident shape as shown in (d) of FIG. 11. In this case, the distance between a pressure electrode 700 disposed under the first area of (a), (b), (c) and (d) of FIG. 11 and the electrode adjacent to the pressure electrode 700 may be greater than the distance between a pressure electrode 710 disposed under the second area and the electrode adjacent to the pressure electrode 710. As a result, when the pressures having the same magnitude are applied, the magnitude of the touch pressure detected in the second area may be the same as the magnitude of the touch pressure detected in the first area.

Figure 12:
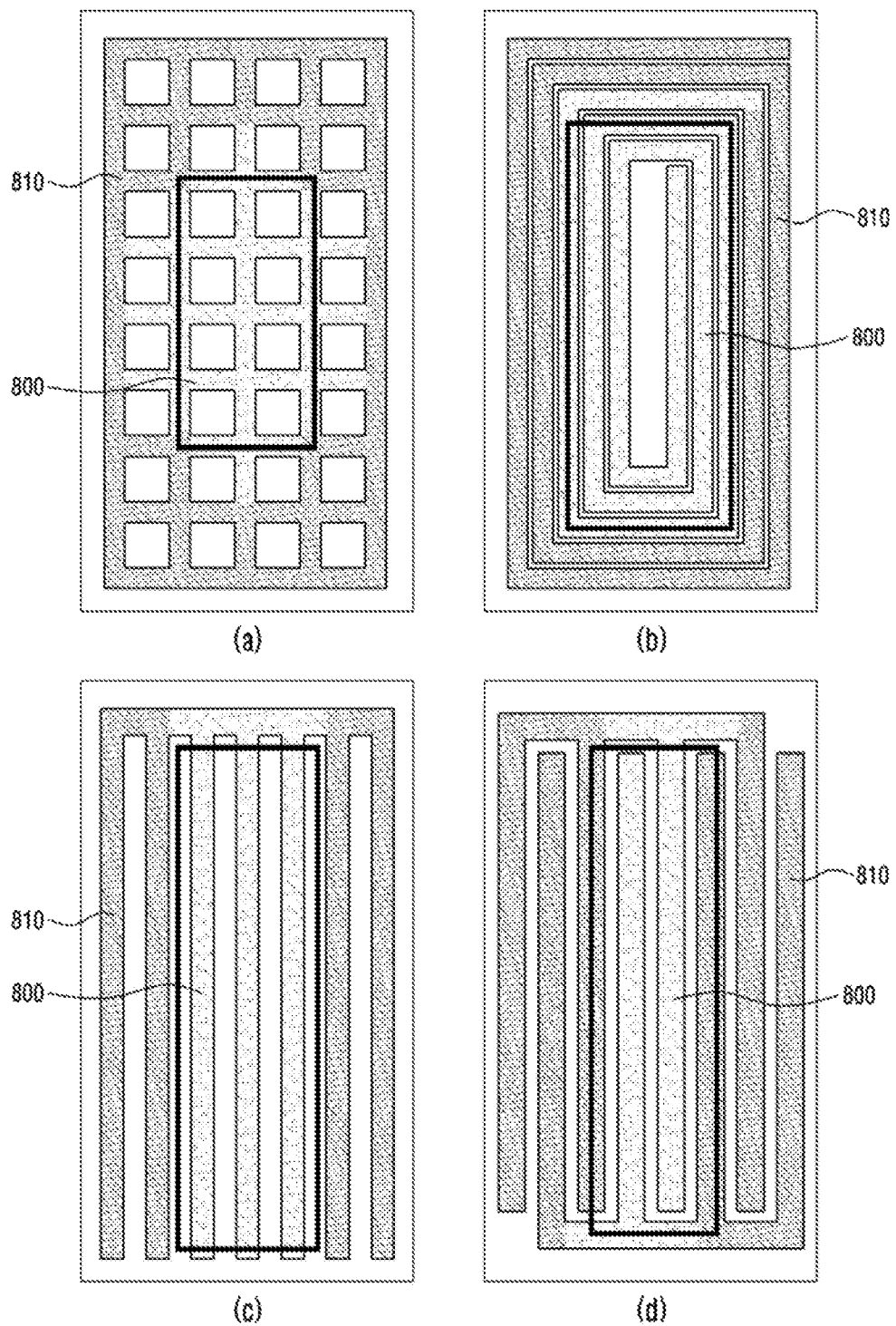

FIG. 12 shows a pressure electrode which can be applied to the third method in the second embodiment of the present invention.

According to the embodiment of the present invention, the pressure electrode may have a grid shape as shown in (a) of FIG. 12, or may have a swirling shape as shown in (b) of FIG. 12. Also the pressure electrode may have a comb teeth shape as shown in (c) of FIG. 12, or may have a trident shape as shown in (d) of FIG. 12. In this case, the distance between a pressure electrode 800 disposed under the first area of (a), (b), (c) and (d) of FIG. 12 and the reference potential electrode may be greater than the distance between a pressure electrode 810 disposed under the second area and the reference potential electrode. As a result, when the pressures having the same magnitude are applied, the magnitude of the touch pressure detected in the second area may be the same as the magnitude of the touch pressure detected in the first area.

Figure 13:
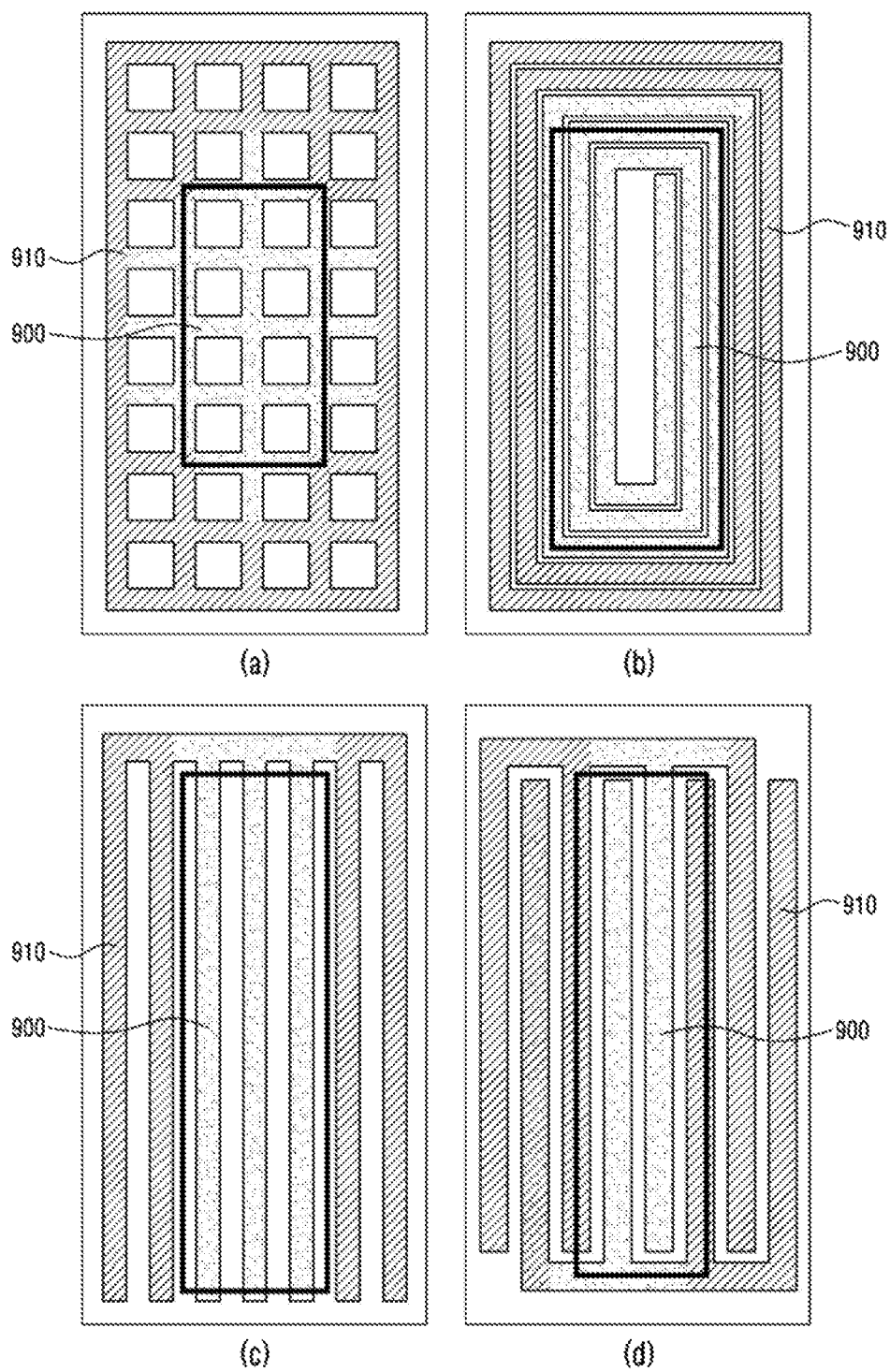

FIG. 13 shows a pressure electrode which can be applied to the fourth method in the second embodiment of the present invention.

According to the embodiment of the present invention, the pressure electrode may have a grid shape as shown in (a) of FIG. 13, or may have a swirling shape as shown in (b) of FIG. 13. Also, the pressure electrode may have a comb teeth shape as shown in (c) of FIG. 13, or may have a trident shape as shown in (d) of FIG. 13. In this case, the material composition constituting a pressure electrode 900 disposed under the first area of (a), (b), (c) and (d) of FIG. 13 may be different from the material composition constituting a pressure electrode 910 disposed under the second area. As a result, when the pressures having the same magnitude are applied, the magnitude of the touch pressure detected in the second area may be the same as the magnitude of the touch pressure detected in the first area.

FIG. 14 shows a structure in which the pressure electrode is formed, as shown in (a), (b), (c) and (d) of FIG. 14, in the remaining area other than the central portion.

While the pressure electrode has been described, the pressure electrode according to the embodiment of the present invention can be implemented by various methods including the above described methods.

FIGS. 15a, 15b, 15c, and 15d show the pressure electrodes which are applied to the embodiment of the present invention, and graphs showing a capacitance change amount depending on the touch position of the touch input device 1000 including these pressure electrodes.

Figure 15A:
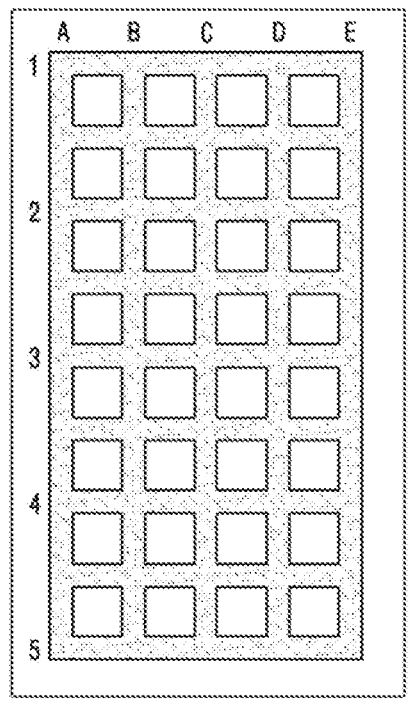
FIGS. 15a, 15b, 15c, and 15d show the pressure electrodes which are applied to the embodiment of the present invention, and graphs showing a capacitance change amount depending on the touch position of the touch input device including these pressure electrodes.
Figure 15B:
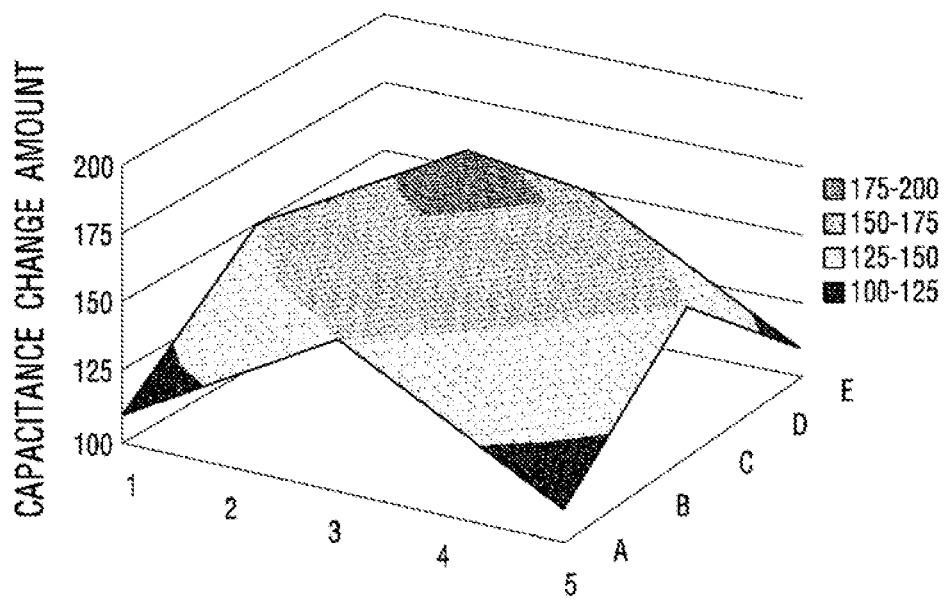

FIG. 15b is a graph showing the capacitance change amount depending on the touch position for the pressure having the same magnitude in the touch input device 1000 including the pressure electrode according to the first embodiment as shown in FIG. 15a. Referring to FIGS. 10a and 10b, it can be seen that, when the object applies the touch pressure to the central portion of the touch input device 1000, the greatest capacitance change amount can be obtained. Also, it can be found that the closer it is to the edge of the touch input device 1000, the less the capacitance change amount is.

Figure 15C:
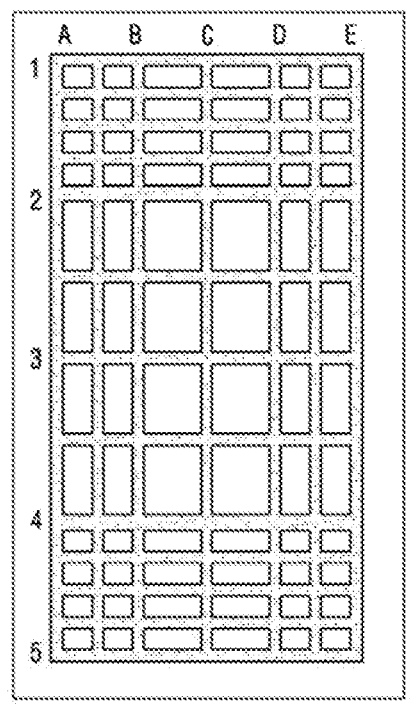
Figure 15D:
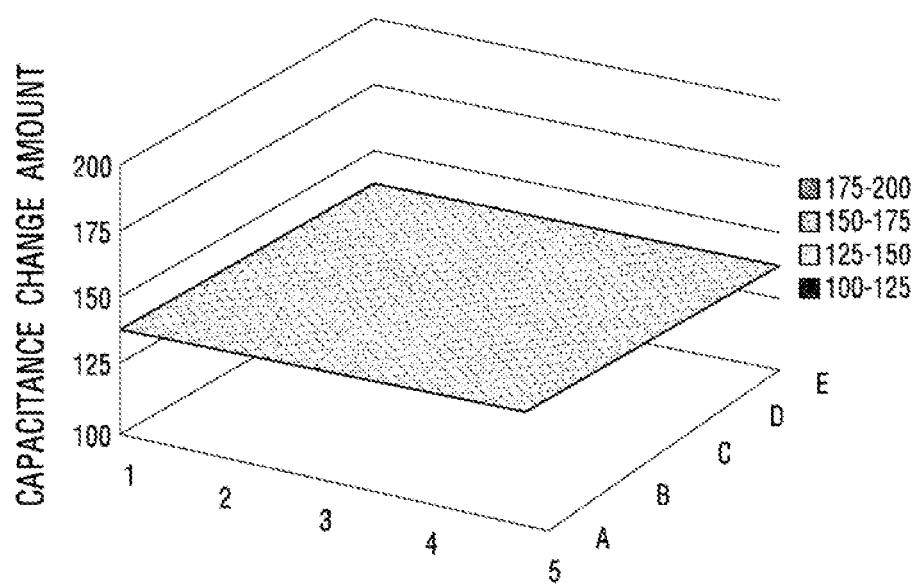

FIG. 15*d* is a graph showing the capacitance change amount depending on the touch position for the press me having the same magnitude in the touch input device 1000 including the pressure electrode according to the embodiment as shown in FIG. 15*c*. Referring to FIGS. 10*c* and 10*d*, it can be seen that the capacitance change amount is constant regardless of the touch position.

The foregoing has been provided by assuming that the first area is the central portion of the display panel and the second area is the edge portion of the display panel. However, there is no limit to this. When a pressure detect ion sensitivity is changed according to the position of the display panel, an area with high pressure detection sensitivity can be set as the first area, and an area with low pressure detection sensitivity can be set as the second area.

The features, structures and effects and the like described in the embodiments are included in at least one embodiment of the present invention and are not necessarily limited to one embodiment. Furthermore, the features, structures, effects and the like provided in each embodiment cart be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A touch input device capable of detecting a pressure of a touch on a touch surface, the touch input device comprising:
   a display panel, and
   an electrode disposed under the display panel:
   wherein, when a pressure is applied to the touch surface, the display panel is bent;
   wherein an electrical characteristic which is detected at the electrode is changed by the bending of the display panel;
   wherein a magnitude of the pressure applied to the touch surface is detected according to the change amount of the electrical characteristic;
   wherein the display panel comprises a first area and a second area;
   wherein a pressure detection sensitivity of the first area is higher than a pressure detection sensitivity of the second area; and
   wherein, under a condition that the first area and the second area of the display panel are bent to the same degree, a change amount of the electrical characteristic detected when a pressure is applied to the second area is greater than a change amount of the electrical characteristic detected when a pressure is applied to the first area.

2. The touch input device of claim 1 wherein the first area is more bent than the second area when a pressure with the same magnitude is applied to the first area and the second area.

3. The touch input device of claim 1, wherein the electrode comprises at least one single electrode, and wherein the electrical characteristic detected at the single electrode is changed by applying the pressure to the touch surface.

4. The touch input device of claim 1, wherein the electrode is disposed on the display panel.

5. The touch input device of claim 1, wherein a width of the electrode disposed under the first area is less than a width of the electrode disposed under the second area.

6. The touch input device of claim 1, wherein a distance between the electrode disposed under the first area and an electrode adjacent to the electrode disposed under the first area is greater than a distance between the electrode disposed under the second area and an electrode adjacent to the electrode disposed under the second area.

7. The touch input device of claim 1, wherein material composition constituting the electrode disposed under the first area is different from material composition constituting the electrode disposed under the second area.

8. The touch input device of claim 1,
   wherein the electrode is formed in the form of an electrode sheet;
   wherein the electrode sheet comprises a first insulation layer and a second insulation layer; and
   wherein at least one of the first insulation layer and the second insulation layer is made of any one of polyimide and Polyethylene Terephthalate (PET).

9. The touch input device of claim 1, wherein the electrode is made of at least one of copper, aluminum (Al), and silver (Ag).

10. An electrode sheet which is disposed on a touch input device comprising a display panel and is used to detect a magnitude of a pressure applied to a touch surface of the touch input device, the electrode sheet comprising:
    a first insulation layer and a second insulation layer; and
    an electrode located between the first insulation layer and the second insulation layer;
    wherein, when a pressure is applied to the touch surface, the display panel is bent;
    wherein an electrical characteristic which is detected at the electrode is changed by the bending of the display panel;
    wherein a magnitude of the pressure applied to the touch surface is detected according to the change amount of the electrical characteristic;
    wherein the display panel comprises a first area and a second area;
    wherein a pressure detection sensitivity of the first area is higher than a pressure detection sensitivity of the second area; and
    wherein, under a condition that the first area and the second area of the display panel are bent to the same degree, a change amount of the electrical characteristic detected when a pressure is applied to the second area is greater than a change amount of the electrical characteristic detected when a pressure is applied to the first area.

11. The electrode sheet of claim 10, wherein the first area is more bent than the second area when a pressure with the same magnitude is applied to the first area and the second area.

12. The electrode sheet of claim 10, wherein the electrode comprises at least one single electrode, and wherein the electrical characteristic detected at the single electrode is changed by applying the pressure to the touch surface.

13. The electrode sheet of claim 10, wherein the electrode sheet is attached to the display panel.

14. The electrode sheet of claim 10, wherein a width of the electrode disposed under the first area is less than a width of the electrode disposed under the second area.

15. The electrode sheet of claim 10, wherein a distance between the electrode disposed under the first area and an electrode adjacent to the electrode disposed under the first area is greater than a distance between the electrode disposed under the second area and an electrode adjacent to the electrode disposed under the second area.

16. The electrode sheet of claim 10, wherein material composition constituting the electrode disposed under the first area is different from material composition constituting the electrode disposed under the second area.

17. The electrode sheet of claim 10, wherein the electrode is made of at least one of copper, aluminum (Al), and silver (Ag).

* * * * *